(12) United States Patent
Amano

(10) Patent No.: US 7,170,353 B2
(45) Date of Patent: Jan. 30, 2007

(54) BALANCED AMPLIFIER CIRCUIT AND HIGH-FREQUENCY COMMUNICATION APPARATUS

(75) Inventor: Yoshihisa Amano, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 25 days.

(21) Appl. No.: 10/963,732

(22) Filed: Oct. 14, 2004

(65) Prior Publication Data

US 2005/0083133 A1 Apr. 21, 2005

(30) Foreign Application Priority Data

Oct. 15, 2003 (JP) ............................ P2003-354889
Sep. 21, 2004 (JP) ............................ P2004-273603

(51) Int. Cl.
*H03F 1/22* (2006.01)
(52) U.S. Cl. ...................... 330/295; 330/301; 330/302
(58) Field of Classification Search ................ 330/301, 330/302, 295, 124 R
See application file for complete search history.

(56) References Cited

U.S. PATENT DOCUMENTS 5,625,205 A * 4/1997 Kusama ...................... 257/197
6,954,623 B1 * 10/2005 Chang et al. ............. 455/127.1

FOREIGN PATENT DOCUMENTS

JP 2001-267857 A 9/2001

* cited by examiner

*Primary Examiner*—Robert Pascal
*Assistant Examiner*—Hieu Nguyen
(74) *Attorney, Agent, or Firm*—Birch, Stewart, Kolasch & Birch, LLP

(57) ABSTRACT

Between an output terminal (drain terminal) of a semiconductor device in a first unit amplifier and an output port, a −90 degrees phase-shift circuit is connected, while between an output terminal (drain terminal) of a semiconductor device in a second unit amplifier and the output port, a +90 degrees phase-shift circuit is connected. Between the first and second ports, there is inserted a series circuit made up of first and second inductance components with an almost identical size. Then, to a middle point between the first and second inductance components, a bias feed terminal is connected, and between the middle point and a ground, a series circuit made up of a resistance component and a capacitance component is connected. The small-size balanced amplifier circuit can perform accurate balance operation in wide bands.

14 Claims, 17 Drawing Sheets

FREQUENCY (2.500GHz to 5.500GHz)

BALANCED AMPLIFIER CIRCUIT AND HIGH-FREQUENCY COMMUNICATION APPARATUS

This Nonprovisional application claims priority under 35 U.S.C. §119(a) on Patent Applications Nos. P2003-354889 and P2004-273603 respectively filed in Japan on Oct. 15, 2003 and Sep. 21, 2004, the entire contents of which are hereby incorporated by reference.

BACKGROUND OF THE INVENTION

The present invention relates to a balanced amplifier circuit and a high-frequency communication apparatus, and an amplifier circuit (amplifier) in a high-frequency communication apparatus such as cell phones. More specifically, the present invention relates to a power amplifier.

It is widely known that methods for designing amplifier circuits are roughly divided into a single-ended type and a balanced type. The single-ended amplifier circuit, which is a two-terminal circuit having one input port and one output port, is a very generally and widely used circuit. The balanced amplifier circuit is structured such that two systems of single-ended amplifier circuits are disposed in parallel and driven in opposite phase before produced power is combined. The balanced amplifier circuit is used when high-efficiency amplification through push-pull operation is desired or suppression of even harmonics is desired.

The present invention focuses on the balanced amplifier circuit in high-frequency bands such as microwave bands and millimeter wave bands. As the prior art suitable for such high-frequency bands, a number of circuit modes are stated in JP 2001-267857 A for example. As it is difficult to cover and discuss all the circuit modes stated therein, two modes will be selected and described as typical examples.

FIG. 19 shows a circuit mode disclosed in the JP 2001-267857 A as an example selected as the first prior art, which combines and divides power with use of a distributed constant circuit-type 180-degrees Wilkinson power divider. In order to facilitate later comparison to the present invention, FIG. 19 in the present specification is illustrated so as to make up for deficient portions (e.g., bias circuit) in JP 2001-267857 A.

In FIG. 19, two systems of unit amplifiers 1911, 1912 are single-ended amplifier circuits respectively composed of input-side matching circuits 1907, 1909, semiconductor devices 1905, 1906, and output-side matching circuits 1908, 1910. In FIG. 19, FET (Field Effect Transistor) one-stage amplifier circuits are illustrated for easy understanding, although multi-stage amplifier circuits with use of other semiconductor devices (e.g., bipolar transistors) are also applicable. Drain terminals of the semiconductor devices 1905, 1906 are respectively connected to bias feed terminals 1903, 1904. Generally, as a low-pass filter circuit for preventing leakage of high-frequency signals, inductance components L1901, L1902 are respectively inserted in series immediately before the bias feed terminals 1903, 1904, and capacitance components C1901, C1902 are connected to between the bias feed terminals 1903, 1904 and grounds.

An electric signal given to an input port 1901 is divided in opposite phase and inputted into two systems of unit amplifiers 1911, 1912. The division of power in opposite phase is implemented by only one out of two outputs from a distributed Wilkinson power divider 1913 composed of a resistance R 1901 and two ¼-wavelength transmission lines T1903, T1904 being set to pass a 180-degrees phase-shift circuit composed of a half-wavelength transmission line T1901.

Power outputs in opposite phase from each other, which come from the two systems of unit amplifiers 1911, 1912 that are driven in opposite phase, are combined and then outputted from an output port 1902. The combination of power in opposite phase is implemented by only one out of two power outputs from two systems being set to pass a 180-degrees phase-shift circuit composed of a half-wavelength transmission line T1902 and then both the power outputs being combined in phase by a distributed Wilkinson power combiner 1914 composed of a resistance R 1902 and two ¼-wavelength transmission lines T1905, T1906.

FIG. 20 shows a circuit mode disclosed in the JP 2001-267857 A as an example selected as the second prior art, which combines and divides power with use of a lumped constant circuit-type 180-degrees Wilkinson power divider. In order to facilitate later comparison to the present invention, FIG. 20 in the present specification is illustrated so as to make up for deficient portions (e.g., bias circuit) in JP 2001-267857 A.

The circuit of FIG. 20 has a structure similar to that of FIG. 19 described before except that the distributed constant circuit is replaced with a lumped constant circuit, and shares the same principle of operation. In FIG. 20, two systems of unit amplifiers 2011, 2012 are single-ended amplifier circuits respectively composed of input-side matching circuits 2007, 2009, semiconductor devices 2005, 2006, and output-side matching circuits 2008, 2010. Drain terminals of the semiconductor devices 2005, 2006 are respectively connected to bias feed terminals 2003, 2004. As a low-pass filter circuit for preventing leakage of high-frequency signals, inductance components L2001, L2002 are respectively inserted in series immediately before the bias feed terminals 2003, 2004, and capacitance components C2001, C2002 are connected to between the bias feed terminals 2003, 2004 and grounds.

The distributed Wilkinson power divider 1913 in FIG. 19 is replaced with a lumped constant Wilkinson power divider composed of a resistance R2001, three capacitance components C2003, C2011, C2005, and two inductance components L2003, L2004 in FIG. 20. The distributed Wilkinson power divider 1914 in FIG. 19 is replaced with a lumped constant Wilkinson power divider composed of a resistance R2002, three capacitance components C2004, C2008, C2012, and two inductance components L2006, L2005 in FIG. 20. Two distributed phase-shift circuits T1901, T1902 in FIG. 19 are replaced with lumped constant phase-shift circuits 2013, 2014 in FIG. 20. The lumped constant phase-shift circuit 2013, which is a multi-stage circuit with capacitance components and inductance components disposed alternatively, is composed of two inductance components L2010, L2009 that are connected in series, and two capacitance components C2010, C2009 that are respectively connected to between input terminals of the inductance components L2010, L2009 and grounds. Moreover, the lumped constant phase-shift circuit 2014, which is a multi-stage circuit with capacitance components and inductance components disposed alternatively, is composed of two inductance components L2007, L2008 that are connected in series, and two capacitance components C2006, C2007 that are respectively connected to between output terminals of the inductance components L2007, L2008 and grounds.

Meanwhile, the present invention relates not only to a single amplifier circuit but also to the structure of a transmission system of a high-frequency communication apparatus incorporating the amplifier circuit. Eventually, description will be also given of the transmission system of a high-frequency communication apparatus in the prior art with reference to FIG. 17. The high-frequency communication apparatus in FIG. 17 is an example assuming a multi-mode and multiband cell phone such as the fourth generation cell phones. As the communication systems subject to multimode and multiband development, there are assumed four systems: 800 MHz-band cell phone; 1.9 GHz-band cell phone; 2.4 GHz-band wireless LAN; and 5.2 GHz-band wireless LAN. Inside a casing 1721, four systems of narrow-band transmission circuits are disposed in parallel corresponding to these four communication systems. A transmission signal in 800 MHz band is produced in a transmission signal source 1713, sent to a transmission amplifier 1705 through a transmission balun 1709 to be amplified, and emitted from an antenna 1701. A transmission signal in 1.9 GHz band is produced in a transmission signal source 1714, sent to a transmission amplifier 1706 through a transmission balun 1710 to be amplified, and emitted from an antenna 1702. A transmission signal in 2.4 GHz band is produced in a transmission signal source 1715, sent to a transmission amplifier 1707 through a transmission balun 1711 to be amplified, and emitted from an antenna 1703. A transmission signal in 5.2 GHz band is produced in a transmission signal source 1716, sent to a transmission amplifier 1708 through a transmission balun 1712 to be amplified, and emitted from an antenna 1704.

The reason why the communication baluns 1709 to 1712 are necessary is that as a trend of recent high-frequency circuit technologies, the transmission signal sources 1713 to 1716 are often realized with use of RFIC (Radio Frequency Integrated Circuit) technology. Generally, the inside of the RFIC is constituted from a balanced differential circuit, and therefore an output portion of the RFIC are generally composed of differential lines 1717 to 1720. On the contrary, most of the amplifier circuits in high-frequency bands (power amplifiers in particular) are a single-ended type, which necessitates the transmission baluns 1709 to 1712 for converting the differential lines (balance lines) to single-ended lines.

FIG. 18 is a view showing the operation of the circuit in FIG. 17 with schematic frequency spectrums. The 800 MHz band incorporates a narrow amplification band 1801 for the transmission amplifier 1705, the 1.9 GHz band incorporates a narrow amplification band 1802 for the transmission amplifier 1706, the 2.4 GHz band incorporates a narrow amplification band 1803 for the transmission amplifier 1707, and the 5.2 GHz band incorporates a narrow amplification band 1804 for the transmission amplifier 1708.

The balanced amplifier circuits (FIGS. 19 and 20) in the prior art had following two problems.

The first problem of the prior art is their large size. As pointed out in the JP 2001-267857 A, the prior art example of FIG. 20 achieved certain downsizing with heavy use of compacted lumped constant devices compared to the prior art example of FIG. 19. However, the prior art example of FIG. 20 falls short of sufficient downsizing because of following two reasons.

The first reason is the increased number of lumped constant devices. Regarding the problem of the number of the devices, discussion will be given later in this specification with a specific comparison to the present invention. The second reason is that lumped constant devices L2001, L2002, C2001, C2002 in the bias feed portion take extremely large device values for achieving a sufficient low-pass filter effect. For example, in the case of a MMIC (Monolithic Microwave Integrated Circuit) configuration, a large LC device value signifies large-area spiral inductance and MIM (Metal Insulator Metal) capacitance, resulting in considerable increase in a chip area.

The second problem in the prior art is that frequency bands in which a circuit performs a normal balance operation, i.e., the frequency bands in which two semiconductor devices 2005, 2006 are driven in opposite phase by almost exactly 180 degrees, become extremely narrow. This is a fundamental problem attributed to the circuit structure itself of FIG. 20 (and FIG. 19). The circuits of FIG. 20 and FIG. 19 depend on the 180-degrees phase-shift circuits T1901, T1902, 2013, 2014, and in such simple phase-shift circuits, 180-degrees phase-shift characteristics can be accurately implemented only in extremely narrow bands.

Whether or not the opposite-phase driving is accurately implemented is in most cases an issue relating to the nature of the balanced amplifier and therefore has importance. If the accurate opposite-phase driving is not required, then it is not necessary in first place to adopt the balanced amplifier structure, and so the normal single-ended amplifier structure is good enough. Typical cases where the balanced amplifier is required include, first, the case where it is desired to perform high-efficiency amplification through push-pull operation, and second, the case where it is desired to suppress second harmonic distortion and second harmonic spurious so as to achieve high-linearity amplification. In these cases, if the opposite-phase driving is not accurately implemented, the first case suffers a problem that efficiency as the amplifier is considerably deteriorated, while the second case suffers a problem that the second harmonic distortion and second harmonic spurious are not fully suppressed and end up to be leaked.

The aforementioned problem of the prior art that accurate balance operation is implemented only in a narrow band is extremely difficult to understand, and therefore in this specification, discussion will be given later with a specific comparison to the present invention.

In the high-frequency communication device (FIG. 17) in the prior art, following various problems have been caused by the fact that the baluns 1709 to 1712 are indispensable. First of all, a number of baluns 1709 to 1712 are required, which leads to increase in size and cost of the apparatus. Moreover, the insertion loss due to the baluns 1709 to 1712 is exerted on a transmission-system circuit which handles bulk power signals, which attributes to the increase in battery consumption. Further, as the most serious problem, difficulty for the baluns 1709 to 1712 to support wider bands attributes to inability to develop a multimode and multiband transmission system in the fullest sense.

FIG. 17 is a view assuming a multimode and multiband high-frequency wireless communication apparatus, which in actuality is composed of a plurality of transmission-system circuits arrayed simply inside a casing 1721, and therefore increase in size, weight and cost is unavoidable. In order to share and simplify the circuits, the circuits should be able to support wider bands so that a communication system in a certain band (e.g., 800 MHz) can receive a transmission signal in a different band (e.g., 5.2 GHz). However, many circuit components currently in use have difficulty to support wider bands as wide as 800 MHz to 5.2 GHz, and balun components (1709 to 1712) designed to be small in size and low in cost are included therein.

SUMMARY OF THE INVENTION

In order to solve the above-described problems in the prior art, an object of the present invention is to provide a small-size high-frequency amplifier circuit capable of performing accurate balance operation in wide bands. Another object of the present invention is to decrease the number of component members in the high-frequency communication apparatus and to achieve a multimode and multiband high-frequency communication apparatus.

In order to accomplish the above-stated objects, a balanced amplifier circuit in a first invention in which a single-ended first unit amplifier and a single-ended second unit amplifier are disposed in parallel and driven substantially with a phase difference of 180 degrees and substantially at identical amplitude, with an output terminal of a semiconductor device in a last stage in the first unit amplifier being a first node, an output terminal of a semiconductor device in a last stage in the second unit amplifier being a second node, and a single output terminal of the amplifier circuit as a whole being a third node; comprises:

a −90 degrees phase-shift circuit for shifting phase substantially by −90 degrees which is connected to between the first node and the third node;

a +90 degrees phase-shift circuit for shifting phase substantially by +90 degrees which is connected to between the second node and the third node;

a first inductance component and a second inductance component having substantially an identical size which are connected to between the first node and the second node;

a bias feed terminal connected to a middle point between the first inductance component and the second inductance component for feeding a DC bias to the semiconductor device in the last stage in the first unit amplifier and to the semiconductor device in the last stage in the second unit amplifier.

According to the above-structured balanced amplifier circuit, fed DC bias power, which is prevented from being leaked to the ground by the presence of the capacitance component, passes through the first and second inductance components and is fed to the semiconductor devices in the last stage of the first and second unit amplifiers for driving two semiconductor devices in opposite phase. In this point, since two first and second inductance components are almost identical in size, the middle point becomes a virtual ground point with respect to high frequency, and therefore leakage of high-frequency signals is considerably suppressed. Therefore, it becomes possible to implement a small-size balanced amplifier circuit capable of performing accurate balance operation in wide bands.

Further, a second balanced amplifier circuit in a second invention in which a single-ended first unit amplifier and a single-ended second unit amplifier are disposed in parallel and driven substantially with a phase difference of 180 degrees and substantially at identical amplitude, with an output terminal of a semiconductor device in a last stage in the first unit amplifier being a first node, an output terminal of a semiconductor device in a last stage in the second unit amplifier being a second node, and a single output terminal of the amplifier circuit as a whole being a third node; comprises:

a −90 degrees phase-shift circuit for shifting phase substantially by −90 degrees which is connected to between the first node and the third node;

a +90 degrees phase-shift circuit for shifting phase substantially by +90 degrees which is connected to between the second node and the third node;

a first inductance component and a second inductance component having substantially an identical size which are connected in series between the first node and the second node;

a bias feed terminal connected to a middle point between the first inductance component and the second inductance component for feeding a DC bias to the semiconductor device in the last stage in the first unit amplifier and to the semiconductor device in the last stage in the second unit amplifier;

a first capacitance component and a second capacitance component having substantially an identical size which are connected in series between the first node and the second node; and a resistance component connected to between a middle point between the first capacitance component and the second capacitance component and a ground.

According to the above-structured balanced amplifier circuit, fed DC bias power, which is prevented from being leaked to the ground by the presence of the first and second capacitance components, passes through the first and second inductance components and is fed to the semiconductor devices in the last stage of the first and second unit amplifiers for driving two semiconductor devices in opposite phase. In this point, since two first and second inductance components are almost identical in size, the middle point becomes a virtual ground point with respect to high frequency, and therefore leakage of high-frequency signals is considerably suppressed. Therefore, it becomes possible to implement a small-size balanced amplifier circuit capable of performing accurate balance operation in wide bands.

Further, in a balanced amplifier circuit in one embodiment, the +90 degrees phase-shift circuit includes natural numbers of inductance components connected in series and integer numbers of capacitance components connected to between end points of the inductance components and grounds.

According to the balanced amplifier circuit in the aforementioned embodiment, a multistage circuit including natural numbers of inductance components connected in series and integer numbers of capacitance components connected to between end points of the inductance components and grounds is used as the +90 degrees phase-shift circuit so that wider bands can be supported.

In a balanced amplifier circuit in one embodiment, it is preferable from the same view point that the −90 degrees phase-shift circuit includes natural numbers of inductance components connected in series and integer numbers of capacitance components connected to between end points of the inductance components and grounds.

Further, in a balanced amplifier circuit in one embodiment, the +90 degrees phase-shift circuit is a high-frequency transmission line having a length which substantially corresponds to ¼ wavelength in operating frequency bands.

According to the balanced amplifier circuit in the aforementioned embodiment, a high-frequency transmission line having a length which substantially corresponds to ¼ wavelength in operating frequency bands is used as the +90 degrees phase-shift circuit, so that a phase-shift circuit supporting microwave bands (including millimeter wave bands) can be implemented at a low cost. Further, since the high-frequency transmission line is superior to the lumped constant phase-shift circuit in a Q value and processing accuracy, the performance can be improved and the production tolerance can be diminished.

Further, in a balanced amplifier circuit in one embodiment, the −90 degrees phase-shift circuit includes natural numbers of capacitance components connected in series and integer numbers of inductance components connected to between end points of the capacitance components and grounds.

According to the balanced amplifier circuit in the aforementioned embodiment, a multistage circuit including natural numbers of capacitance components connected in series and integer numbers of inductance components connected to between end points of the capacitance components and grounds is used as the −90 degrees phase-shift circuit so that wider bands can be supported.

In a balanced amplifier circuit in one embodiment, it is preferable from the same view point that the −90 degrees phase-shift circuit includes natural numbers of capacitance components connected in series and integer numbers of inductance components connected to between end points of the capacitance components and grounds.

Further, in a balanced amplifier circuit in one embodiment, the −90 degrees phase-shift circuit is a high-frequency transmission line having a length which substantially corresponds to ¾ wavelength in operating frequency bands.

According to the balanced amplifier circuit in the aforementioned embodiment, a high-frequency transmission line for almost a ¾ wavelength in operating frequency bands is used as the −90 degrees phase-shift circuit, so that a phase-shift circuit supporting microwave bands (including millimeter wave bands) can be implemented at a low cost. Further, since the high-frequency transmission line is superior to the lumped constant phase-shift circuit in a Q value and processing accuracy, the performance can be improved and the production tolerance can be diminished.

Further, a high-frequency communication apparatus in the present invention comprises the balanced amplifier circuit of the first or second invention for use as a balun function-cum-amplifier function for amplifying a modulated signal produced in a balanced output RFIC and sending the signal to a single-ended input high-frequency circuit.

The balanced amplifier circuit having balun function-cum-amplifier function in the first or second invention as described above is used as a circuit for amplifying a modulated signal produced in a balanced output RFIC and sending the signal to a single-ended input high-frequency circuit, which allows the high-frequency communication apparatus to have decreased size, weight and cost.

Further, a high-frequency communication apparatus in one embodiment comprises:

a plurality of the balanced amplifier circuits, wherein
each fractional bandwidth (=bandwidth/center frequency) of a plurality of the balanced amplifier circuits is confined to be less than 100% and each bandwidth of the plurality of the balanced amplifier circuits is designed not to overlap to the other bandwidth, so that plurality of the balanced amplifier circuits are used as transmission power amplifiers.

According to the high-frequency communication apparatus in the aforementioned embodiment, a problem of high-frequency spurious radiation can be completely solved. Moreover, although an extremely broadband amplifier circuit is not only difficult to design but also is apt to cause such problem as a remarkable parasitic loss due to the increased circuit size, such a problem can be solved by confining the each fractional bandwidth to be less than 100%.

As is clear from the above description, according to the balanced amplifier circuit in the present invention, it is possible to implement a small-size high-frequency amplifier circuit capable of performing almost accurate balance operation in wide bands. Moreover, in the high-frequency communication apparatus of the present invention, decrease in size, cost and power consumption, as well as wider bands are accomplished.

Further, according to the balanced amplifier circuit in the present invention, an amplifier circuit having an incorporated balun function, particularly, a high-power amplifier may be implemented, which makes it possible to facilitate reduction in the number of component members and implementation of a multimode and multiband high-frequency communication apparatus.

Additionally, a balanced amplifier circuit in one embodiment preferably comprises a capacitance component and a resistance component connected in series between a middle point between the first inductance component and the second inductance component and a ground.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Hereinbelow, more specific and detailed description will be given of the balanced amplifier circuit and high-frequency communication apparatus in the embodiments of the present invention with reference to the accompanying drawings. Throughout the design examples herein below, a GaAs FET made by NEC Corporation, NE8500100, is used as a semiconductor device. This is because S-parameter of the device is widely and generally disclosed and any ambiguity can be eliminated when the following design examples will be described. However, the semiconductor device in the present invention is not limited to this specific device nor limited to a GaAs FET. Other devices such as bipolar transistors allow similar design.

(The First Embodiment)

Figure 1:
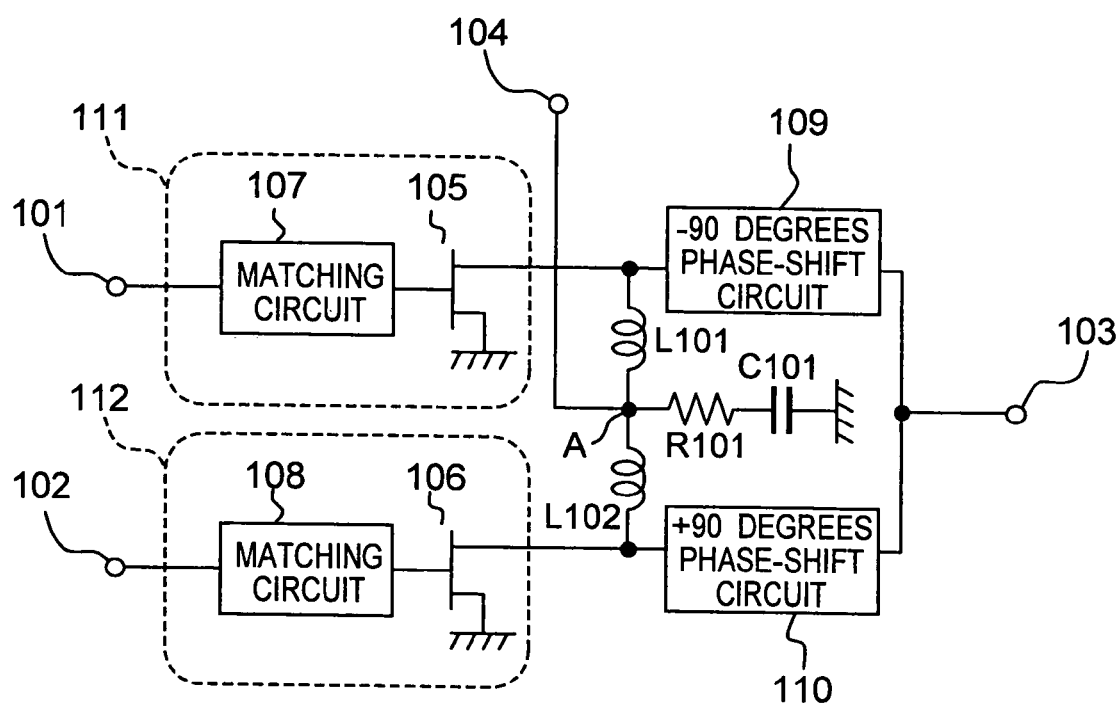
FIG. 1 is a principle view showing a balanced amplifier circuit in a first embodiment of the present invention.
Figure 2:
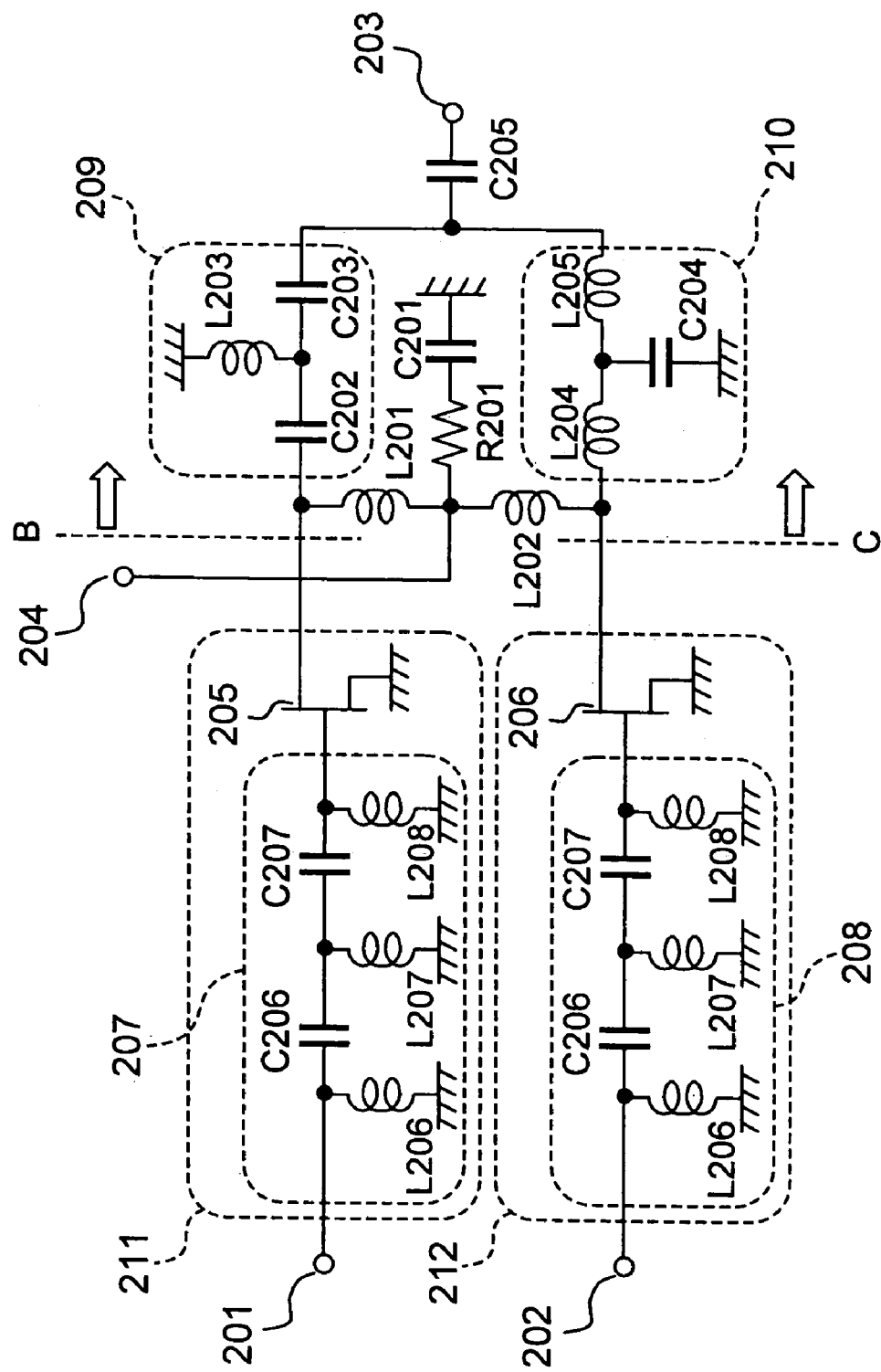
FIG. 2 is a specific circuit view showing the balanced amplifier circuit.

FIG. 1 is a view showing the principle of a balanced amplifier circuit in a first embodiment of the present invention, and FIG. 2 is a specific practical example thereof. For use in later explanation (FIG. 13 and FIG. 14), the circuits in FIG. 1 and FIG. 2 are deliberately designed to be three-terminal circuits. More specifically, the input side is formed to be a balanced two-terminal input, while the output side is formed to be a single-ended one-terminal output. As described later in FIG. 7, adding a balun circuit to the input side of such a three-terminal circuit makes it possible to change it to a normal single-ended input/output two-terminal circuit.

In FIG. 1, an electric signal inputted from a first port 101 constituting a balanced terminal is amplified in a single-ended first unit amplifier 111, while an electric signal inputted from a second port 102 constituting a balanced terminal is amplified in a single-ended second unit amplifier 112. These amplified signals of two systems are finally combined and outputted to a common output port 103 exemplifying a third node.

These two single-ended first and second unit amplifiers 111, 112 are illustrated as FET one-stage amplifiers respectively composed of input-side matching circuits 107, 108 and semiconductor devices (FETs) 105, 106 for easier understanding. However, the first and second unit amplifiers 111, 112 in the present invention are not limited to the one-stage amplifier nor to the FET amplifier.

Between an output terminal (drain terminal) exemplifying a first node of the semiconductor device 105 and the output port 103, a −90 degrees phase-shift circuit 109 is connected, while between an output terminal (drain terminal) exemplifying a second node of the semiconductor device 106 and the output port 103, a +90 degrees phase-shift circuit 110 is connected. Consequently, power outputs from two systems, the semiconductor devices 105, 106 which are driven in opposite phase, are combined in the output port 103 without waste.

Between the output terminals (drain terminals) of two semiconductor devices 105, 106, there is inserted a series circuit made up of two first and second inductance components L101, L102 with an almost identical size. To a middle point (point A) between these two first and second inductance components L101, L102, a bias feed terminal 104 is connected, and between the middle point and a ground, a series circuit made up of a resistance component R101 and a capacitance component C101 is connected. It is to be noted that the resistance component R101 and the capacitance component C101 are provided for the purpose of absorbing and attenuating a second harmonic which is a common component among signal components outputted from the semiconductor devices 105, 106. If the second harmonic is not necessarily a problem in the use of the balanced amplifier circuit, the resistance component R101 and the capacitance component C101 may be removed.

DC power fed from the bias feed terminal 104, which is prevented from leaking to the ground due to the capacitance component C101, passes through the first and second inductance components L101, L102, and is fed to respective output terminals (drain terminals) of the semiconductor devices 105, 106. Then, the two semiconductor devices 105, 106 are driven in opposite phase, and since two first and second inductance components L101, L102 are almost identical in size, the point A becomes a virtual ground point with respect to high frequency. Consequently, without providing a low-pass filter to the bias feed terminal 104 connected to the point A, leakage of high-frequency signals is considerably suppressed. Therefore, large LC devices C2001, C2002, L2001 and L2002 which were necessary in the prior art (FIG. 20) are no longer necessary, thereby achieving considerable downsizing.

FIG. 2 is a specific practical example of the principle view in FIG. 1. In FIG. 2, there are shown a first port 201 constituting a balanced terminal, a second port 202 constituting a balanced terminal, a common output port 203 exemplifying a third node, a single-ended first unit amplifier 211, and a single-ended second unit amplifier 212. Further, there are shown a bias feed terminal 204, semiconductor devices (FETs) 205, 206, input-side matching circuits 207, 208, a −90 degrees phase-shift circuit 209, a +90 degrees phase-shift circuit 210, two first and second inductance components L201, L202 with an almost identical size, a capacitance component C201, and a resistance component R201.

The −90 degrees phase-shift circuit 209, which is equivalent to the −90 degrees phase-shift circuit 109 in FIG. 1, is a multistage circuit with capacitance components and a inductance component alternately disposed, and is composed of two capacitance components C202, C203 connected in series and one inductance component L203 connected to between a junction point between these capacitance components and a ground. Moreover, the +90 degrees phase-shift circuit 210, which is equivalent to the +90 degrees phase-shift circuit 110 in FIG. 1, is a multistage circuit with inductance components and a capacitance component alternately disposed, and is composed of two inductance components L204, L205 connected in series and one capacitance component C204 connected to between a junction point between these inductance components and a ground. Moreover, the matching circuits 207, 208, which are equivalent to the matching circuits 107, 108 in FIG. 1, are multistage circuits with inductance components and capacitance components alternately disposed, and are composed of two capacitance components C206, C207 connected in series, and three inductance components L206, L207, L208 which are connected to between both the sides of the capacitance components C206, C207 connected in series and grounds as well as to between a junction point between the capacitance components and a ground. In order to prevent DC power from the bias feed terminal 204 from leaking to the output port 203, a capacitance component C205 is inserted to between the junction point between the −90 degrees phase-shift circuit 109 and the +90 degrees phase-shift circuit 110 and the output port 203.

Figure 3:
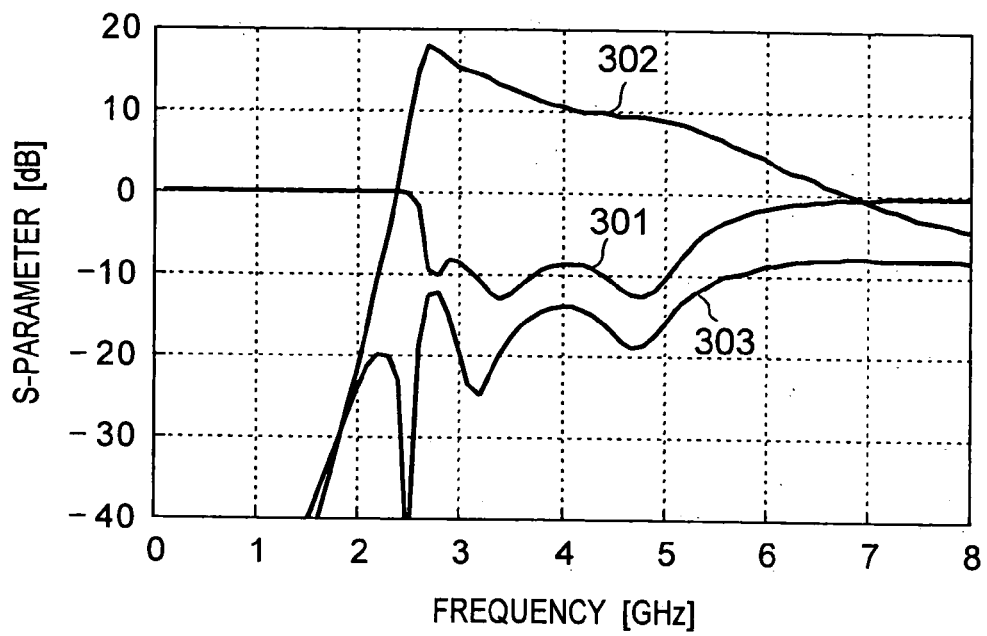
FIG. 3 is a view showing the characteristics of the balanced amplifier circuit.
Figure 4:
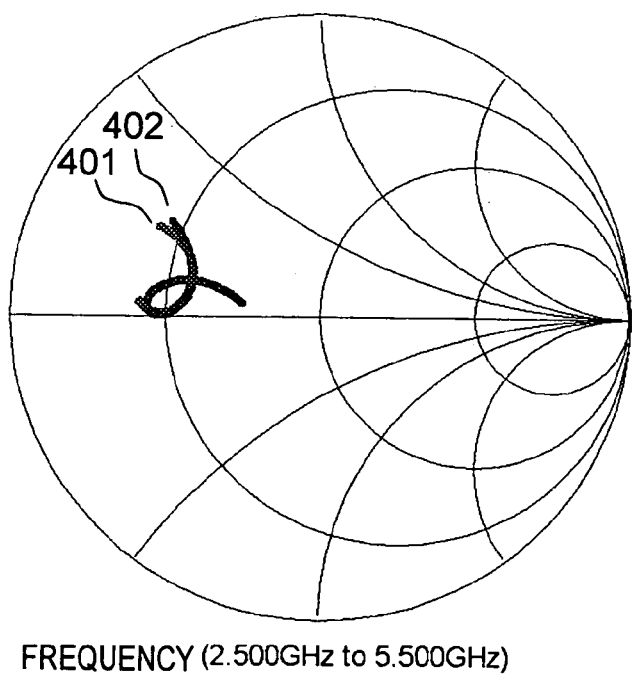
FIG. 4 is a view showing the characteristics of the balanced amplifier circuit.

FIG. 3 and FIG. 4 show characteristic examples of the circuit in FIG. 2. Circuit device values when these results were obtained are as follows: R201=7.11816Ω, C201=10 pF, C202=2.50421 pF, C203=1.97123 pF, C204=1.8089 pF, C205=10 pF, C206=1.51665 pF, C207=2.69547 pF, L201=L202=0.73595 nH, L203=1.16127 nH, L204=0.00126096 nH, L205=0.989952 nH, L206=1.37654 nH, L207=0.459331 nH, and L208=0.375832 nH.

Since the circuit in FIG. 2 receives balanced inputs, the circuit responses should be divided into an opposite-phase (odd mode) input that is an original input mode and a common-phase (even mode) input that is an undesired parasitic component. Particularly, in the present invention shown later (FIG. 13 and FIG. 14), the capability to suppress the common-phase (even mode) parasitic component is important.

Figure 5:
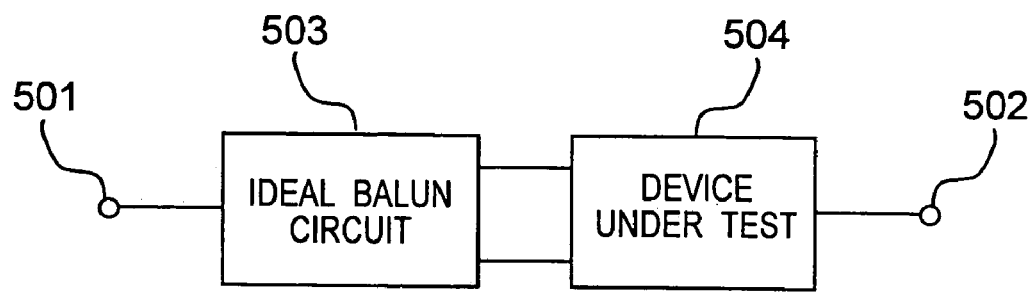
FIG. 5 is a schematic view showing an evaluation system for an odd mode of the balanced amplifier circuit.
Figure 6:
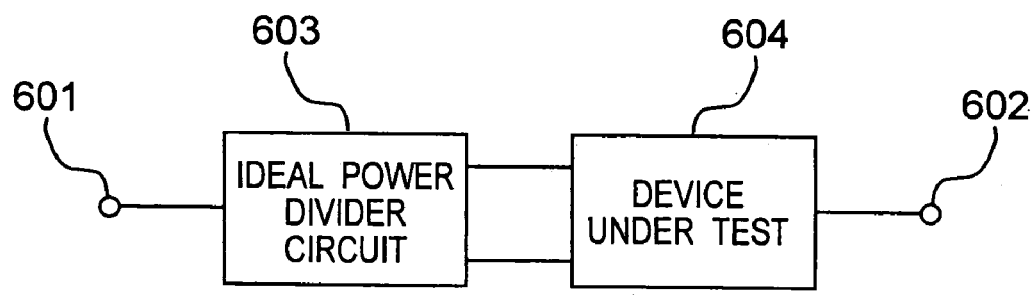
FIG. 6 is a schematic view showing an evaluation system for an even mode of the balanced amplifier circuit.

FIG. 5 and FIG. 6 shows evaluation systems when the results of FIG. 3 and FIG. 4 are obtained. FIG. 5 is an evaluation system for the odd mode, where a circuit 504, that is a device under test, is observed through an ideal balun 503. An output port 502 is a normal 50Ω system, whereas an input port 501 is doubled to be a 100Ω system in consideration of the fact that the ideal balun 503 may gain an impedance conversion function in a parasitic manner. FIG. 6 shows an evaluation system for the even mode, where a circuit 604, that is a device under test, is observed through an ideal divider circuit 603. An output port 602 is a normal 50Ω system, whereas an input port 601 is halved to be a 25Ω system in consideration of the fact that the ideal divider circuit 603 may gain an impedance conversion function in a parasitic manner.

FIG. 3 shows a reflection characteristic and a transmission characteristic (gain characteristic). Though the circuit is small, in the wider band range of 2.5 GHz to 5 Ghz or more, a low reflection characteristic 301 and a high gain characteristic 302 are obtained in the original odd mode input, whereas a gain characteristic 303 is suppressed to be extremely low in the undesired even mode input. This result proves that the amplifier circuit in FIG. 2 is an amplifier circuit implementing almost accurate balance operation over wide bands.

FIG. 4 shows output load circuit characteristics of two unit amplifiers 207, 208 in FIG. 2. More specifically, FIG. 4 shows a reflection coefficient 401 when an arrow direction is seen from a point B in FIG. 2, and a reflection coefficient 402 when an arrow direction is seen from a point C in FIG. 2, both of which are plotted on a Smith chart in the range of 2.5 GHz to 5.5 GHz. As shown in FIG. 4, these reflection characteristics are induced toward a lower impedance side (around the reflection coefficient 0.7<180 degrees) over wide bands. Such output load circuit characteristics are typical characteristics intentionally implemented in designing bulk-power microwave power amplifiers. It means that the circuit in FIG. 2 is also suitable for use as a power amplifier.

Figure 7:
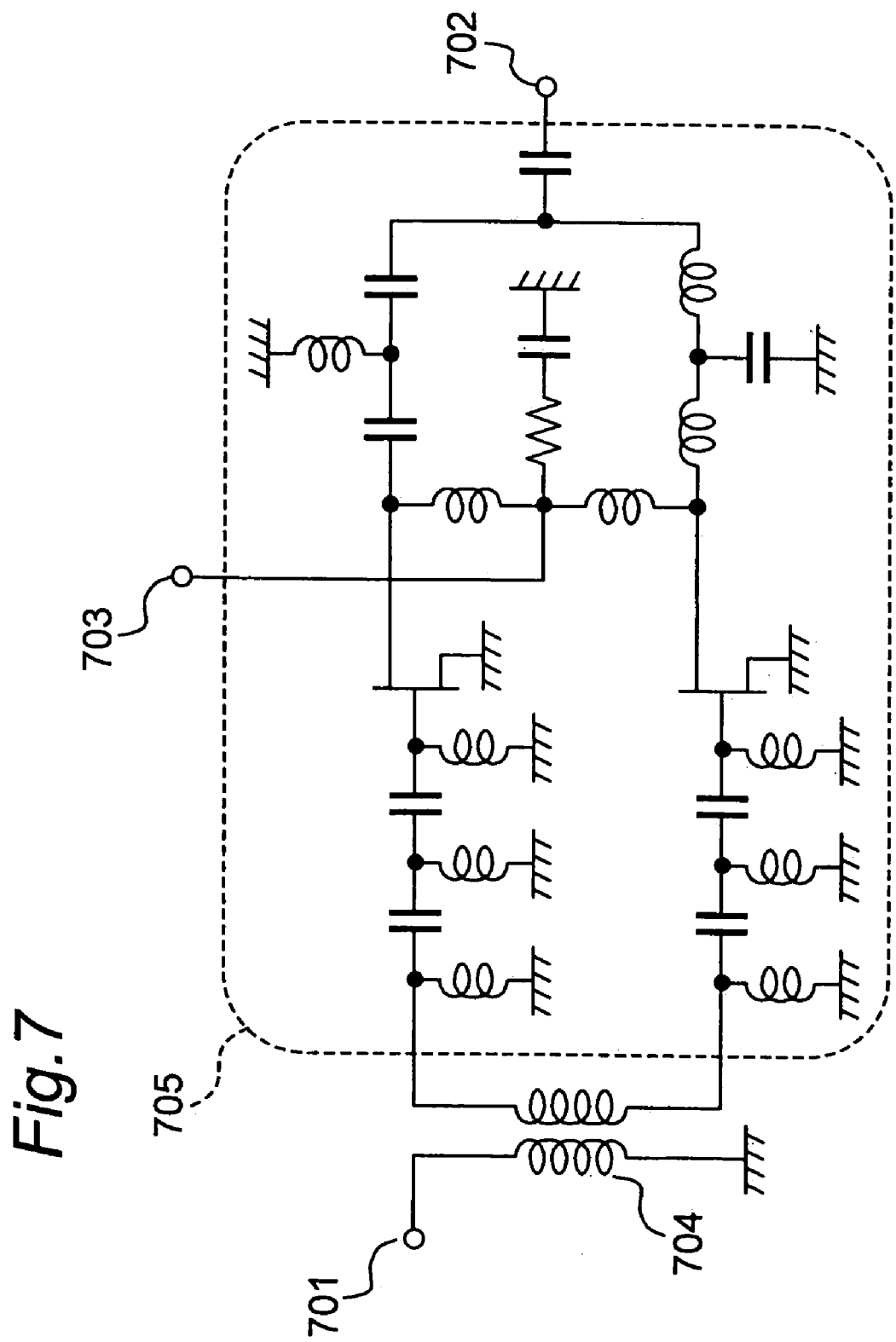
FIG. 7 is a view showing a practical example of a single-ended amplifier circuit with use of balun.
Figure 8:
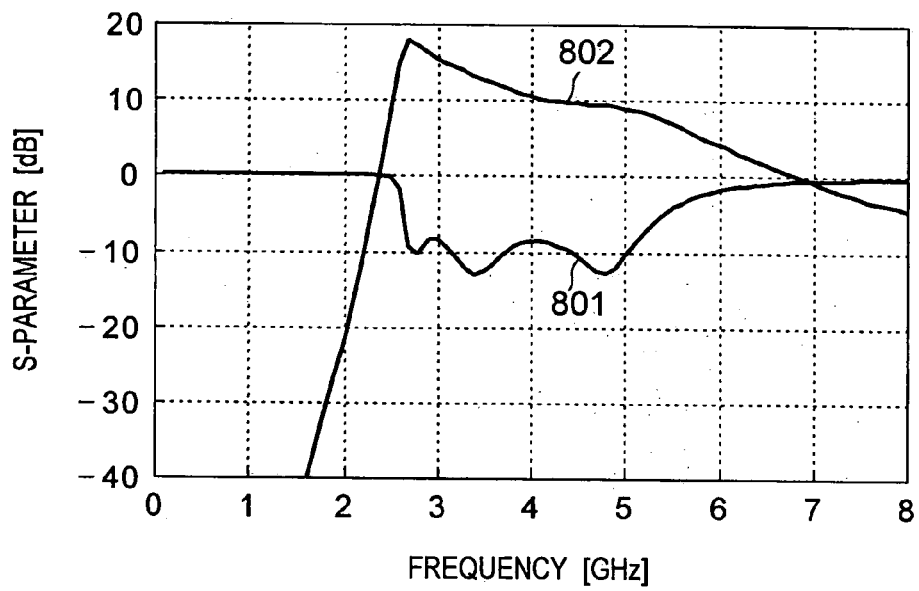
FIG. 8 is a view showing the characteristics of the amplifier circuit of FIG. 7.
Figure 19:
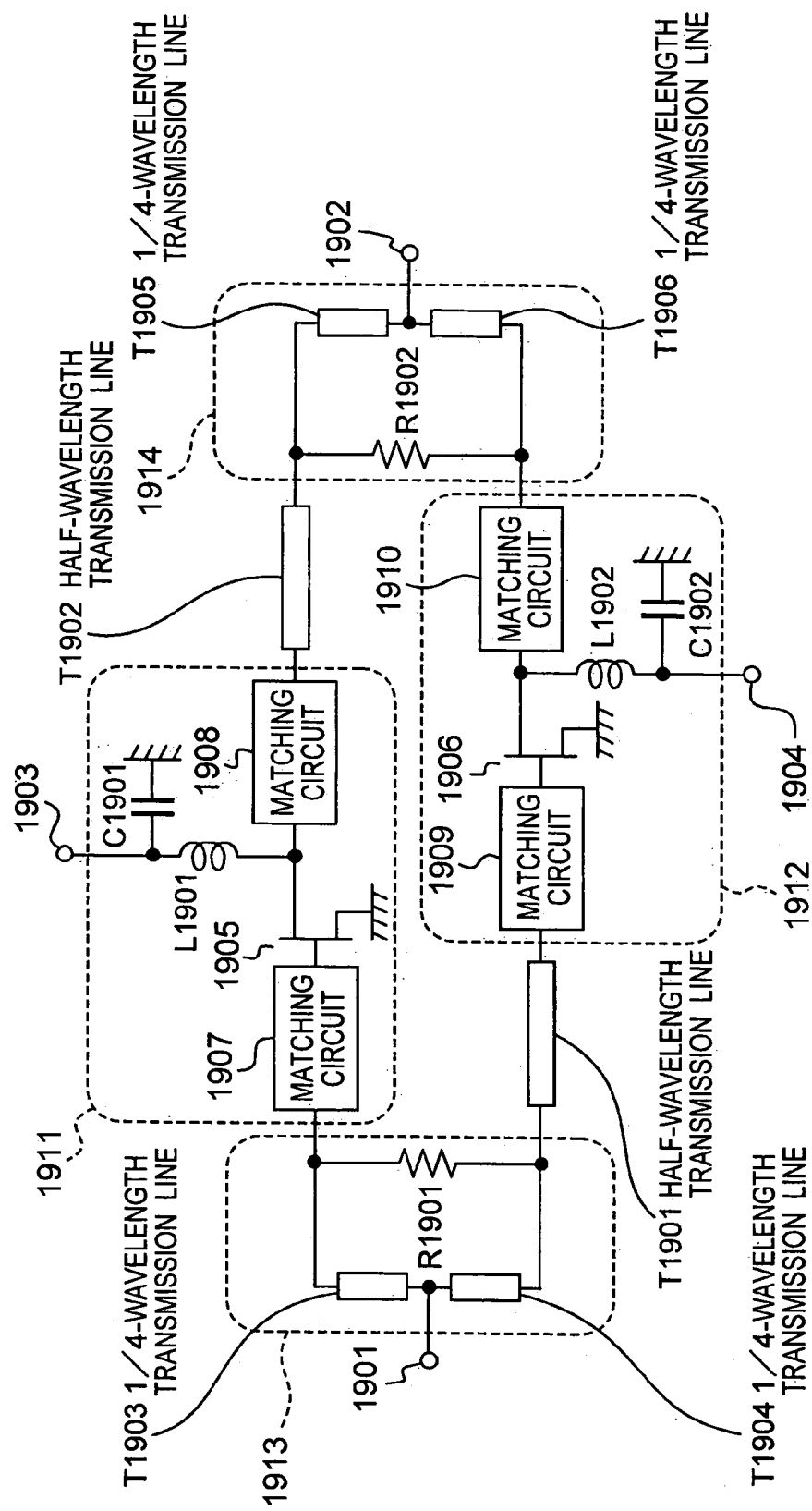
FIG. 19 is a circuit view showing a balanced amplifier circuit in a first prior art.

Since the prior art examples (FIG. 19 and FIG. 20) for comparison are two-terminal single-ended circuits, an example of the circuit in FIG. 2 implemented as a single-ended circuit is shown in FIG. 7. In FIG. 7, the input side of an amplifier circuit 705 in FIG. 2 is connected to an input port 701 through a transformer circuit 704 for balun. An output port 702 is a 50Ω system, while the input port 701 is a 100Ω system for compensating the impedance conversion effect by the transformer 704. FIG. 8 shows a characteristic example of FIG. 7, in which in the range of wide bands, a reflection characteristic 801 is suppressed and high gain characteristic 802 is obtained.

(The Second Embodiment)

Figure 9:
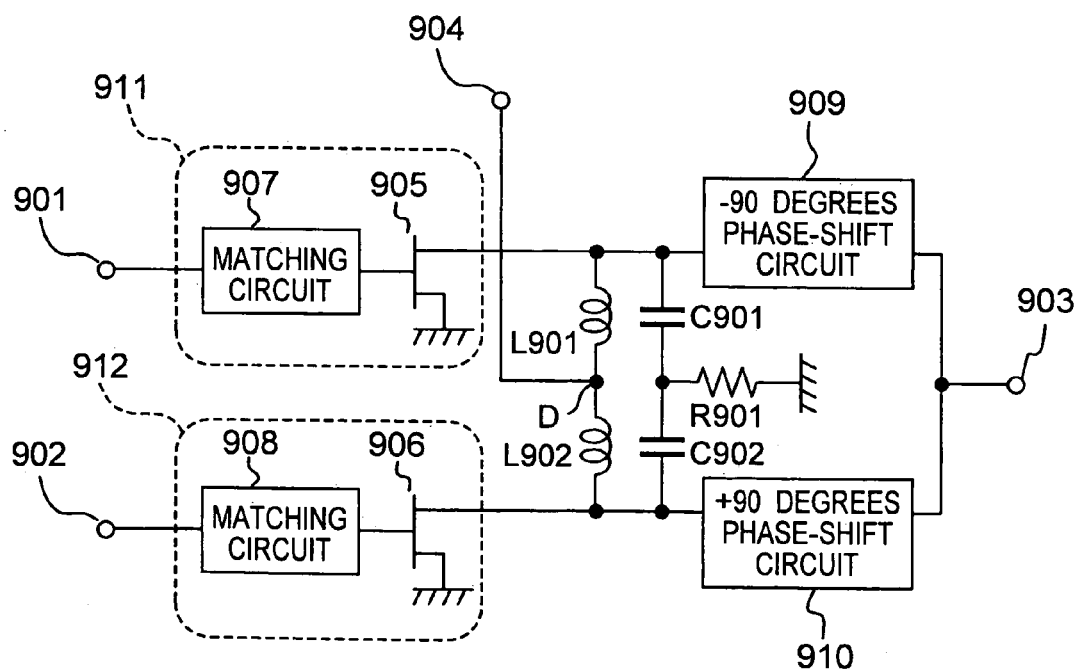
FIG. 9 is a circuit view showing a balanced amplifier circuit in a second embodiment of the present invention.

FIG. 9 is a principle view showing a balanced amplifier circuit in a second embodiment of the present invention. This circuit is almost identical in structure and operation to the first balanced amplifier circuit shown in FIG. 1 except a slightly different structure in the vicinity of the bias feed terminal.

In FIG. 9, there are shown a first port 901 constituting a balanced terminal, a second port 902 constituting a balanced terminal, a common output port 903 exemplifying a third node, a single-ended first unit amplifier 911, and a single-ended second unit amplifier 912. Further, there are shown a bias feed terminal 904, semiconductor devices (FETs) 905, 906, input-side matching circuits 907, 908, a −90 degrees phase-shift circuit 909, and a +90 degrees phase-shift circuit 910.

Between the output terminals (drain terminals) exemplifying first and second nodes of two semiconductor devices 905, 906, there is inserted a series circuit made up of two first and second inductance components L901, L902 with an almost identical size. To a middle point (point D) between these two first and second inductance components L901 and L902, a bias feed terminal 904 is connected. Like the point A in FIG. 1, the point D is a virtual ground with respect to high-frequency signals. Between the output terminals (drain terminals) of two FETs 905 and 906, there is inserted a series circuit made up of two first and second capacitance components C901, C902 with an almost identical size. Between the middle point between these two first and second capacitance components C901 and C902 and a ground, a resistance component R901 is connected.

Figure 10:
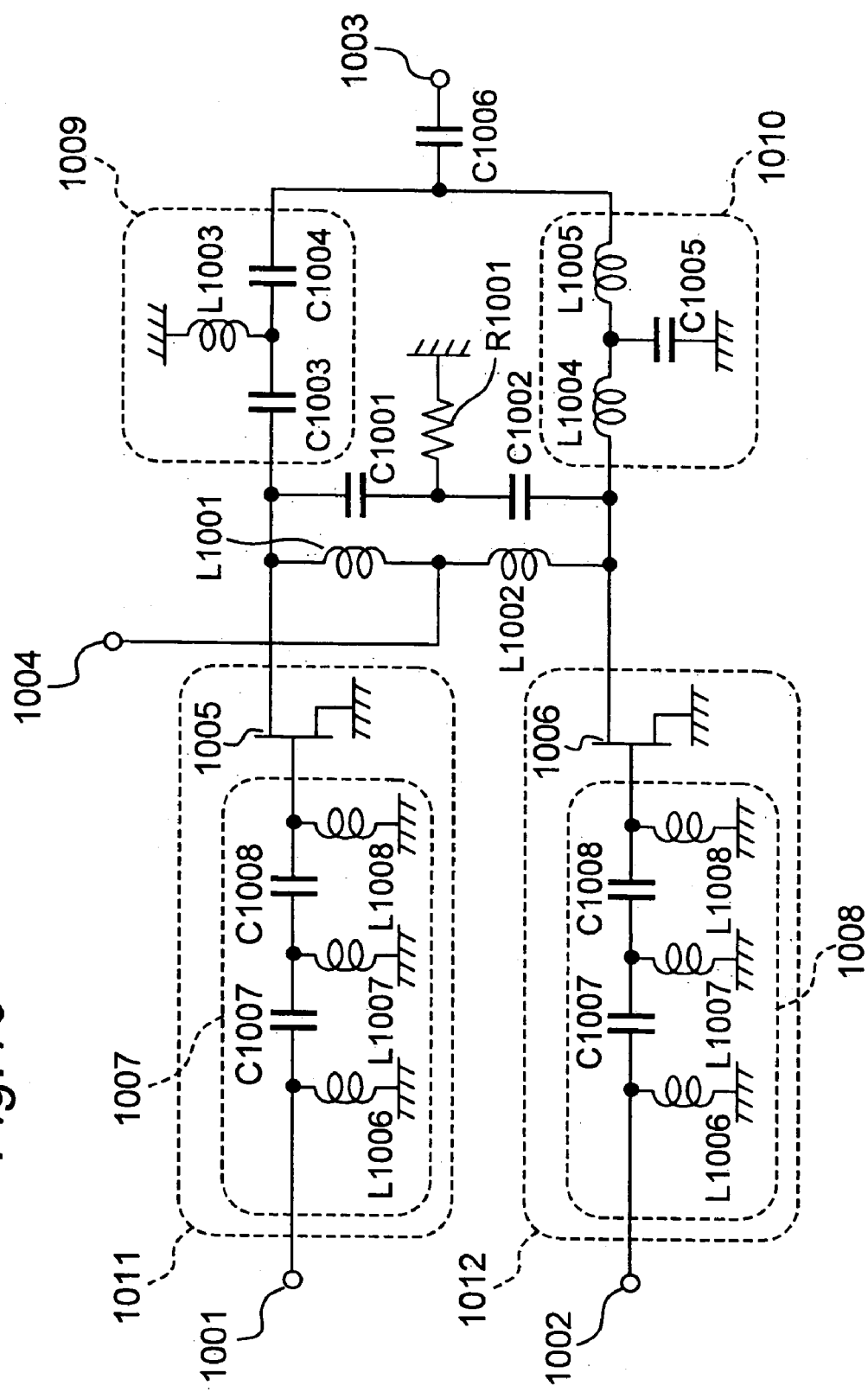
FIG. 10 is a specific circuit view showing the balanced amplifier circuit.

FIG. 10 shows a specific practical example of the principle view of FIG. 9. In FIG. 10, there are shown a first port 1001 constituting a balanced terminal, a second port 1002 constituting a balanced terminal, a common output port 1003 exemplifying a third node, a single-ended first unit amplifier 1011, and a single-ended second unit amplifier 1012. Further, there are shown a bias feed terminal 1004, semiconductor devices (FETs) 1005, 1006, input-side matching circuits 1007, 1008, a −90 degrees phase-shift circuit 1009, a +90 degrees phase-shift circuit 1010, two first and second inductance components L1001, L1002 with an almost identical size, two first and second capacitance components C1001, C1002 with an almost identical size, and a resistance component R1001. In order to prevent DC power from the bias feed terminal 1004 from leaking to the output port 1003, a third capacitance component C1006 is inserted to between the junction point between the −90 degrees phase-shift circuit 1009 and the +90 degrees phase-shift circuit 1010 and the output port 1003.

The −90 degrees phase-shift circuit 1009, which is equivalent to the −90 degrees phase-shift circuit 909 in FIG. 9, is a multistage circuit with capacitance components and a inductance component alternately disposed. The multistage circuit is composed of two capacitance components C1003, C1004 connected in series and one inductance component L1003 connected to between a junction point between these capacitance components and a ground. The +90 degrees phase-shift circuit 1010, which is equivalent to the +90 degrees phase-shift circuit 910 in FIG. 9, is a multistage circuit with inductance components and a capacitance component alternately disposed. The multistage circuit is composed of two inductance components L1004, L1005 connected in series and one parallel capacitance component C1005 connected to between a junction point between these inductance components and a ground. The matching circuits 1007, 1008, which are equivalent to the matching circuits 907, 908 in FIG. 9, are multistage circuits with inductance components and capacitance components alternately disposed. The multistage circuits are composed of two capacitance components C1007, C1008 connected in series, and three inductance components L1006, L1007, L1008 which are connected to between both the sides of the capacitance components C1007, C1008 connected in series and grounds as well as to between a junction point between the capacitance components and a ground.

In the circuit in FIG. 10, the characteristics similar to those of the circuit in FIG. 2 can be achieved if the circuit device values are set, for example, as follows: R1004=4.22884Ω, C1001=C1002=4.7307 pF, C1003=1.72574 pF, C1004=1.56478 pF, C1005=1.28128 pF, C1006=10 pF, C1007=1.51318 pF, C1008=2.49077 pF, L1001=L1002=0.494575 nH, L1003=1.77242 nH, L1004=0.560204 nH, L1005=1.4284 nH, L1006=1.44933 nH, L1007=0.530977 nH, and L1008=0.432486 nH.

The above-stated balanced amplifier circuit in the second embodiment has the same effect as the balanced amplifier circuit in the first embodiment.

(The Third Embodiment)

The method for implementing "−90 degrees phase-shift circuits 109, 909" and "+90 degrees phase-shift circuits 110, 910" in the principle views (FIG. 1 and FIG. 9) in the present invention is not limited to the use of the lumped constant multistage circuit composed of capacitance elements and inductance elements as shown in the specific practical examples (FIG. 2 and FIG. 10). These circuits can be implemented by, for example, distributed circuits.

Figure 11:
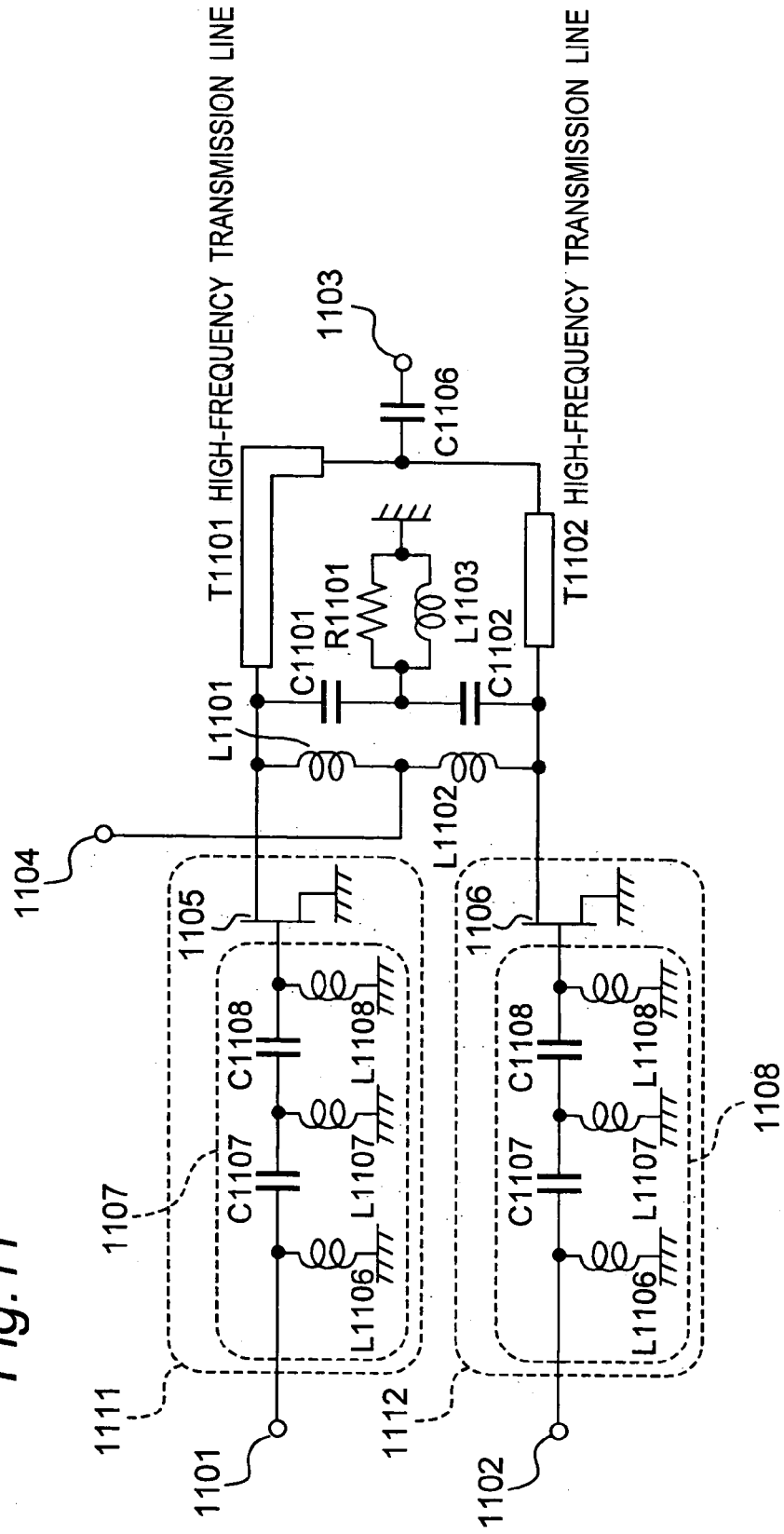
FIG. 11 is a circuit view showing a balanced amplifier circuit in a third embodiment of the present invention.

FIG. 11 is a circuit view showing a balanced amplifier circuit in a third embodiment of the present invention, in which the phase-shift circuit in the balanced amplifier circuit in FIG. 10 is replaced with a distributed circuit. "The −90 degrees phase-shift circuit 1009" is replaced with a high-frequency transmission line T1101 for an almost ¾ wavelength in usable frequency bands. "The +90 degrees phase-shift circuit 1010" is replaced with a high-frequency transmission line T1102 for an almost ¼ wavelength in usable frequency bands.

In FIG. 11, there are shown a first port 1101 constituting a balanced terminal, a second port 1102 constituting a balanced terminal, a common output port 1103 exemplifying a third node, a single-ended first unit amplifier 1111, and a single-ended second unit amplifier 1112. Further, there are shown a bias feed terminal 1104, semiconductor devices (FETs) 1105, 1106, input-side matching circuits 1107, 1108, a −90 degrees phase-shift circuit 1109, a +90 degrees phase-shift circuit 1110, two first and second inductance components L1101, L1102 with an almost identical size, two first and second capacitance components C1001, C1002 with an almost identical size, a resistance component R1101, a third inductance component L1103, and a third capacitance component C1106.

The matching circuits 1107, 1108 are multistage circuits with inductance components and capacitance components alternately disposed. The multistage circuits are composed of two capacitance components C1107, C1108 connected in series, and three inductance components L1106, L1107, L1108 which are connected to between both the sides of the capacitance components C1107, C1108 connected in series and grounds as well as to between a junction point between the capacitance components and a ground.

Figure 12:
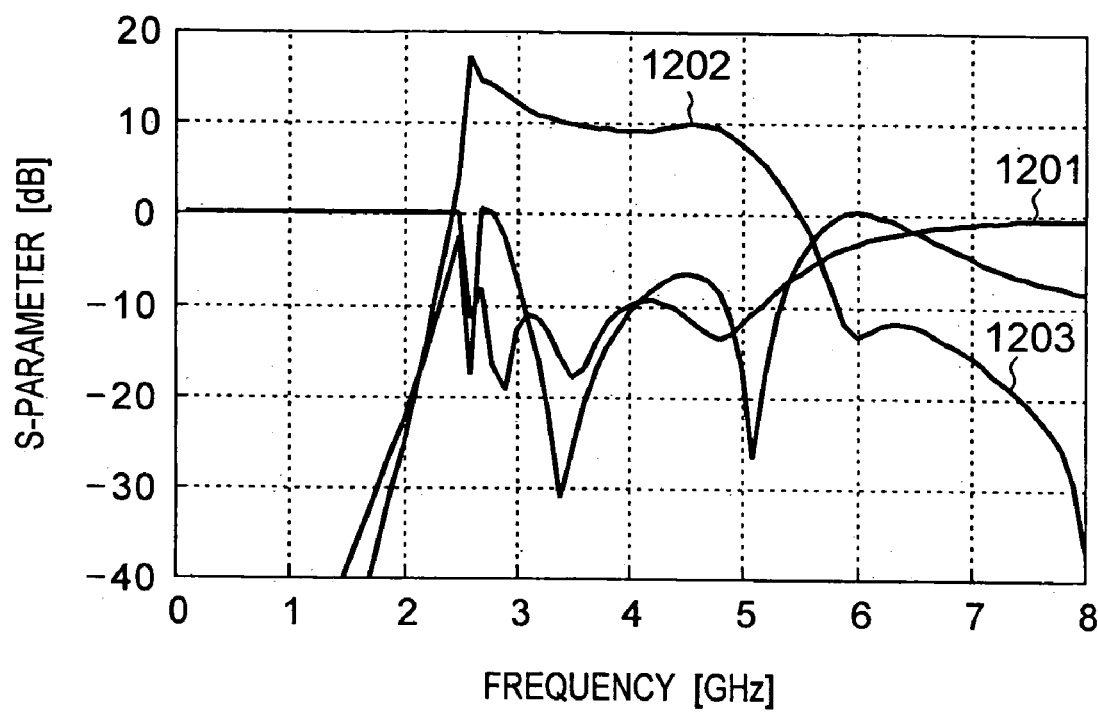
FIG. 12 is a view showing the characteristics of the balanced amplifier circuit.

FIG. 12 is a characteristic example of the balanced amplifier circuit of FIG. 11, showing a simulation result obtained by the evaluation methods in FIG. 5 and FIG. 6. In the range of wider bands of about 2.5 GHz to 5.0 Ghz, a high gain characteristic 1202 is obtained and a reflection characteristic 1201 is suppressed in the case of the opposite-phase input component (odd mode), whereas a gain characteristic 1203 is sufficiently suppressed in the case of the common-phase input component (even mode). The device values when this result is obtained are as follows: R1101=10.6882Ω, C1101=C1102=3.94962 pF, C1106=10 pF, C1007=1.48793 pF, C1108=2.58041 pF, L1101=L1102=0.69093 nH, L1103=0.260744 nH, L1106=1.33881 nH, and L1107=0.471593 nH, L1108=0.371515 nH. The high-frequency transmission line T1101 has a make-shift angle of 261.394 degrees with a characteristic impedance of 51.4587Ω at 4 GHz, whereas the high-frequency transmission line T1102 has a make-shift angle of 78.1384 degrees with a characteristic impedance of 78.1384Ω at 4 GHz.

The above-stated balanced amplifier circuit in the third embodiment has the same effect as the balanced amplifier circuit in the first embodiment.

(The Fourth Embodiment)

Figure 15:
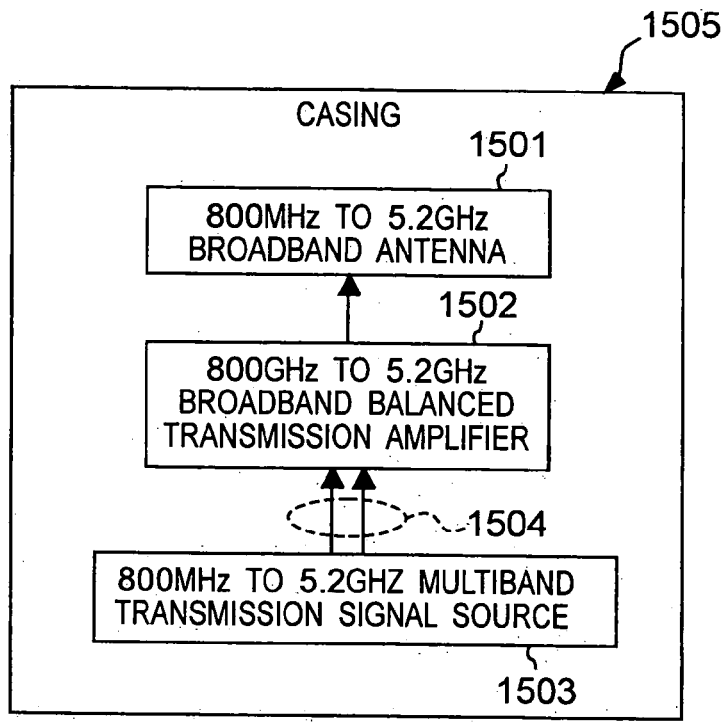
FIG. 15 is a block diagram showing a high-frequency communication apparatus in a fourth embodiment of the present invention.
Figure 17:
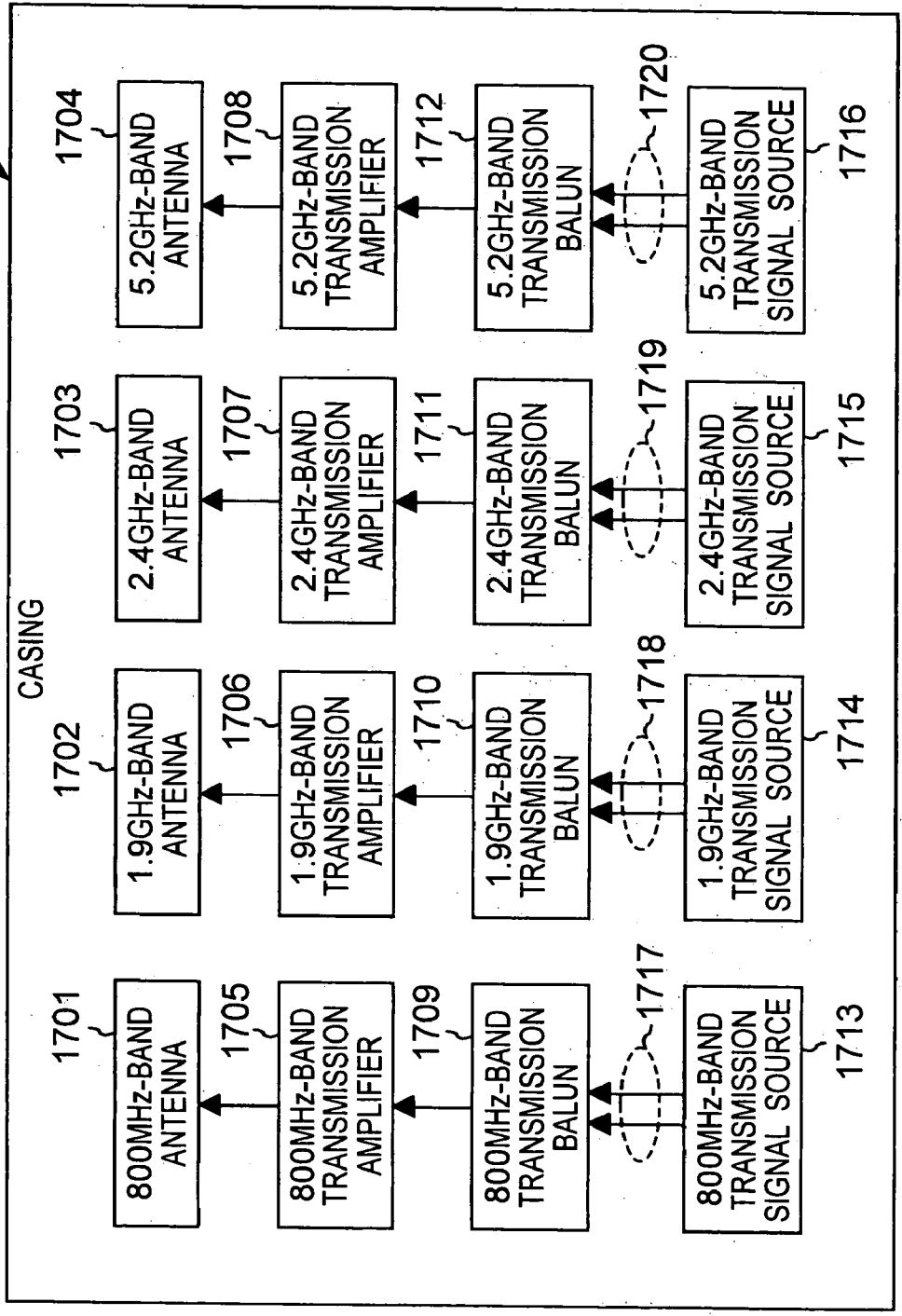
FIG. 17 is a block diagram showing a high-frequency communication apparatus in the prior art.
Figure 18:
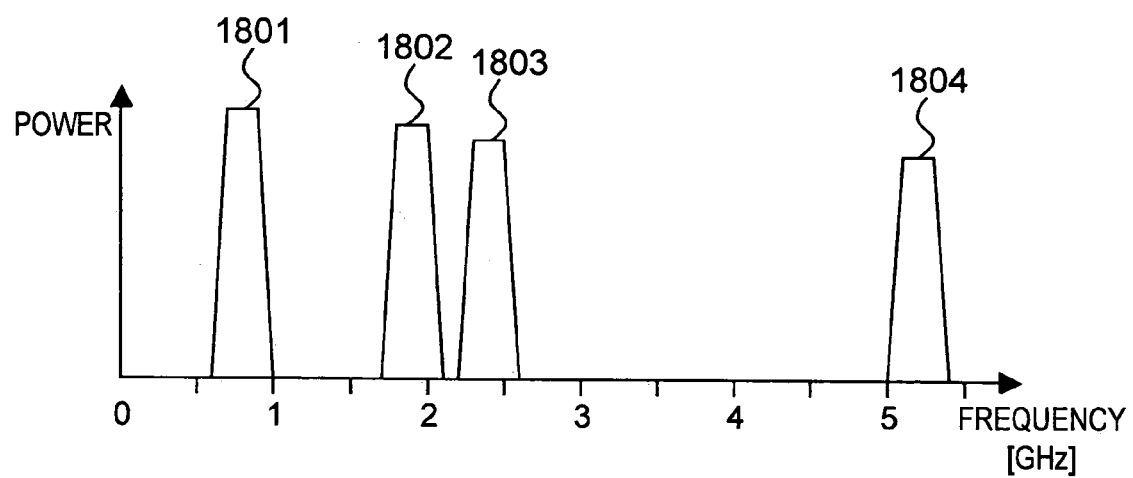
FIG. 18 is a schematic spectral view explaining the circuit operation of the high-frequency communication apparatus.

It is an object of the present invention to decrease the size and cost of the entire high-frequency communication apparatus as well as to enhance the performance thereof focusing on the amplifier circuit. FIG. 15 is an example of a schematic block diagram showing a transmission system of a high-frequency communication apparatus in a fifth embodiment of the present invention in comparison to the prior art in FIG. 17.

In FIG. 15, inside a casing 1505, a transmission signal produced in a RFIC-type multiband transmission signal source 1503 travels through a differential line 1504 and is inputted to a broadband balanced transmission amplifier 1502 incorporating a balanced amplifier circuit (FIG. 1 and FIG. 9) according to the present invention. The amplified signal is radiated by a broadband antenna 1501.

In a high-frequency communication apparatus in FIG. 15, the bandwidth in all the circuits is increased to 800 MHz to 5.2 GHz, which allows remarkable simplification and decrease in size, weight and cost of the circuits compared to the high-frequency communication apparatus (FIG. 17) in the prior art. In considering implementation of broadband high-frequency communication apparatuses as shown in FIG. 15, a broadband antenna 1501 had already introduced commercially for UWB (Ultra Wide Band) systems and the like, and it was also a known fact that a broadband signal source RFIC (1503) could be achieved by adopting the direct conversion method. More specifically, an only serious obstacle for sifting from the prior art (FIG. 17) to the present invention (FIG. 15) was to develop broadband communication amplifiers 1705 to 1708 and baluns 1709 to 1712.

To eliminate the obstacle, the balanced amplifier circuit of the present invention is used, by which a broadband amplifier with an incorporated balun function can be implemented easily. In this case, as specifically shown in FIG. 4, amplifier designing for bulk power amplifiers is available. Because of this, all the conditions required as the transmission amplifier 1502 in FIG. 15 are satisfied. More specifically, the balanced amplifier circuit of the present invention makes it possible to implement drastically-simplified multimode/multiband high-frequency communication apparatuses as shown in FIG. 15.

(The Fifth Embodiment)

The high-frequency communication apparatus in FIG. 15 in the fourth embodiment has one problem, which is a tendency to generate harmonic spurious radiation due to excessive increase in bandwidth of the circuits therein. A high-frequency communication apparatus in the fifth embodiment of the present invention shown in FIG. 13 is an apparatus with the problem fixed.

Figure 16:
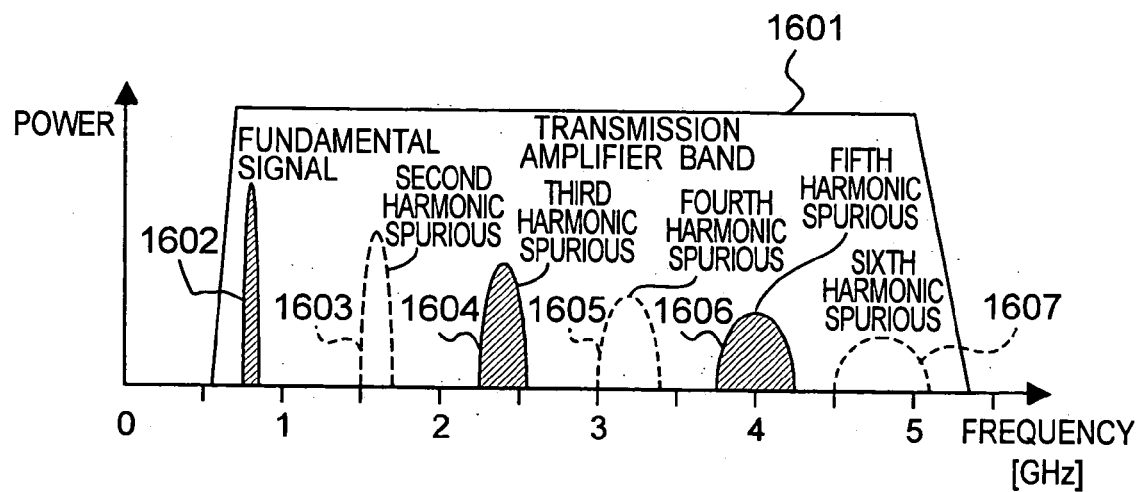
FIG. 16 is a schematic spectral view explaining the circuit operation of the high-frequency communication apparatus.

First, description is given of the mechanism of generation of harmonic spurious in the high-frequency communication apparatus in FIG. 15 in the fourth embodiment with reference to the schematic spectrum view of FIG. 16. The transmission amplifier 1502 in FIG. 15 has, as described before, a wide band 1601 covering the range of about 800 MHz to 5.2 GHz. Once a fundamental signal 1602 of, for example, 800 MHz is inputted to the amplifier, double to sextuple harmonic signals 1603 to 1607 are generated in a band 1601 as shown in FIG. 16. Since these harmonic signals 1603 to 1607 are generated within the band, most of them are radiated from the antenna 1501 without being removed. Out of the second to sixth harmonic spuriouses 1603 to 1607, even harmonic signals 1603, 1605, 1607 are cancelled inside and are not leaked to the outside since the transmission amplifier 1502 is a broadband balanced circuit in FIG. 15. However, odd harmonic signals 1604 and 1606 cannot be removed unless an expensive variable filter circuit is provided behind the transmission amplifier 1502.

Figure 13:
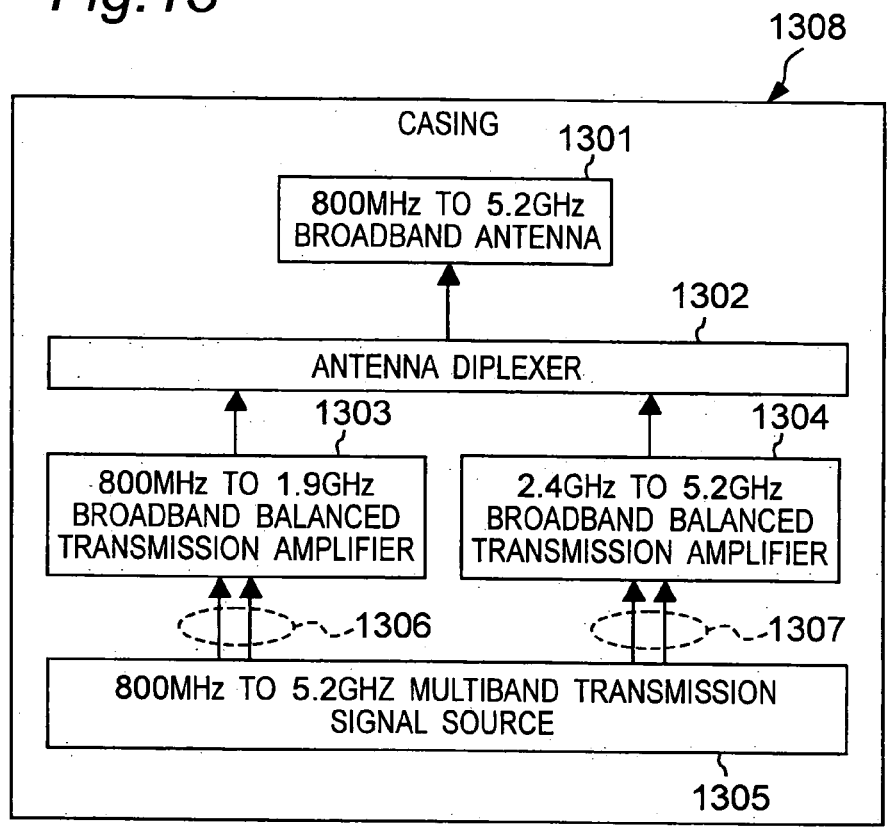
FIG. 13 is a block diagram showing a high-frequency communication apparatus in a fifth embodiment of the present invention.

The high-frequency communication apparatus in the fifth embodiment of the present invention shown in FIG. 13 was devised to prevent the above-described harmonic spurious radiation. Inside a casing 1308, transmission signals generated in a RFIC-type multiband communication signal source 1305 are divided into a low band (800 MHz to 1.9 GHz) signal and a high band signal (2.4 GHz to 5.2 GHz) and processed separately in two systems. The low band signal travels through a differential line 1306 and is inputted into a broadband balanced communication amplifier 1303. After being amplified, the low band signal travels through an antenna diplexer 1302 and is radiated from an antenna 1301. The high band signal travels through a differential line 1307 and is inputted into a broadband balanced communication amplifier 1304 according to the present invention. After being amplified, the high band signal travels through the antenna diplexer 1302 and is radiated from the antenna 1301. The antenna diplexer 1302 may be a lossless power combiner (diplexer) with a filter combined, or may be a switch circuit.

Figure 14:
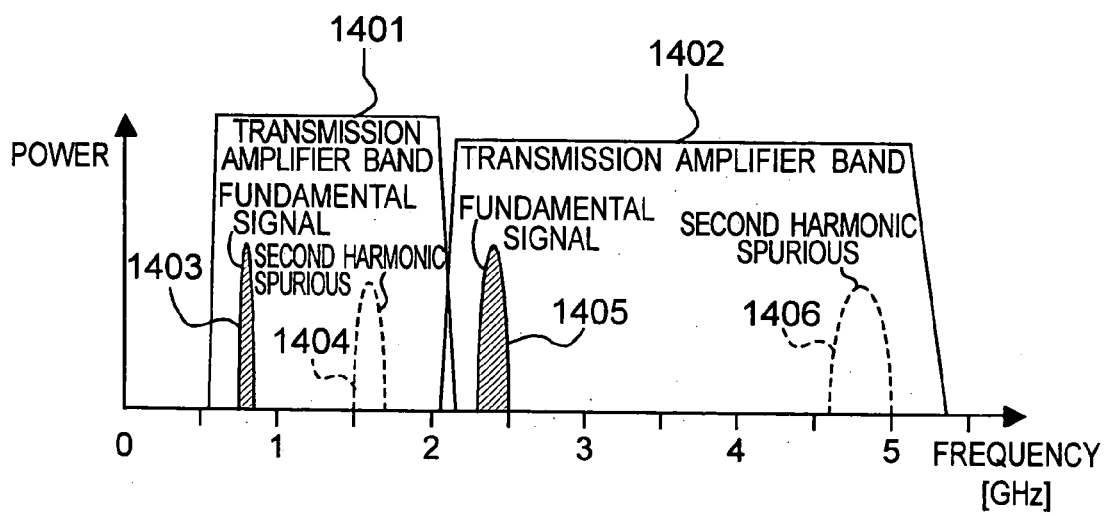
FIG. 14 is a schematic spectral view explaining the circuit operation of the high-frequency communication apparatus.

FIG. 14 is a schematic spectrum view showing the operation of the circuit in FIG. 13. Though the bandwidth of two broadband balanced transmission amplifiers 1303, 1304 in FIG. 14 is wide, they have bands 1401, 1402 in which a fractional bandwidth (=bandwidth/center frequency) is confined to less than 100%. When, for example, 800 MHz fundamental signal 1403 is inputted into the low band communication amplifier 1303, its second harmonic spurious 1404 is within the band 1401, though the third harmonic spurious is no longer within the band, and therefore it is not amplified and leaked out of the amplifier. Similarly, when, for example, 1.9 GHz fundamental signal 1405 is inputted into the high band transmission amplifier 1304, its second harmonic spurious 1404 is within the band 1401, though the third harmonic spurious is no longer within the band, and therefore it is not amplified and leaked out of the amplifier. Moreover, since the communication amplifiers 1303, 1304 are broadband balanced amplifier circuits according to the present invention, the aforementioned second harmonic spuriouses 1404, 1406 are in actuality cancelled within the amplifier and are not leaked to the outside. Thus, although the circuit of the high-frequency communication apparatus of FIG. 13 is slightly more complicated than that of FIG. 15, the problem of harmonic spurious radiation can be solved completely.

Confinement of the each fractional bandwidth of the communication amplifiers 1303, 1304 to less than 100% in the high-frequency communication apparatus of FIG. 13 is advantageous in materializing these communication amplifiers. The amplifier supporting extremely wide bands as shown in FIG. 16 is not only difficult to design but also is apt to cause such problem as a remarkable parasitic loss due to the increased circuit size. Confining the each fractional bandwidth to be less than 100% makes it easy to implement the amplifier circuit free from such a problem.

COMPARATIVE EXAMPLE 1

In order to demonstrate two problems in the prior art (FIG. 20), a problem of the larger number of circuit devices and a problem of inability to perform accurate balance operation in wide bands, a circuit was actually designed. In order to compare the characteristic of the circuit with those of the present invention (FIG. 3), the designed circuit is modified to a balanced input three-terminal circuit as shown in FIG. 21 like the present invention (FIG. 2).

The procedures of the design are as follows: first, two unit amplifiers 2111, 2112 are designed to support wide bands of about 3.5 GHz to 4.5 GHz in 50Ω system, and then these two amplifiers are combined with a lumped constant 180-degrees Wilkinson combiner which is separately designed in 50Ω system.

Figure 21:
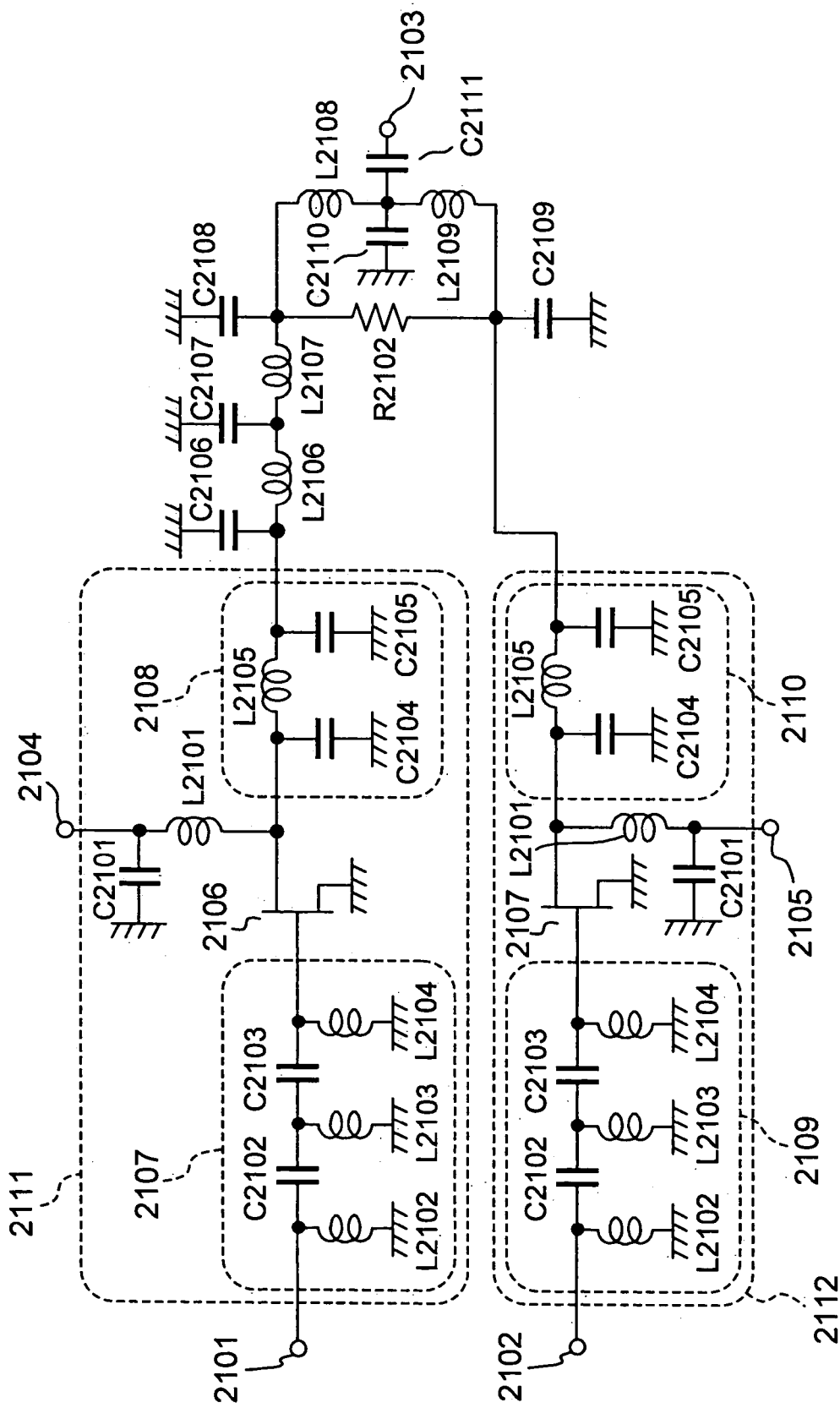
FIG. 21 is a circuit view for comparison to the prior art.

In FIG. 21, two systems of unit amplifiers 2111, 2112 are single-ended amplifier circuits respectively composed of input-side matching circuits 2107, 2109, semiconductor devices 2106, 2107, and output-side matching circuits 2108, 2110. Drain terminals of the semiconductor devices 2106, 2107 are respectively connected to bias feed terminals 2104, 2105. As a low-pass filter circuit for preventing leakage of high-frequency signals, inductance components L2101, L2102 are respectively inserted in series immediately before the bias feed terminals 2104, 2105, and capacitance components C2101, C2102 are connected to between the bias feed terminals 2104, 2105 and grounds. Moreover, in FIG. 21, a resistance R2002, three capacitance components C2106, C2107, C2108, and two inductance components L2106, L2107 constitute a lumped constant Wilkinson combiner. A resistance R2102, three capacitance components C2109, C2110, C2111, and two inductance components L2108, L2109 constitute a lumped constant Wilkinson divider.

Figure 20:
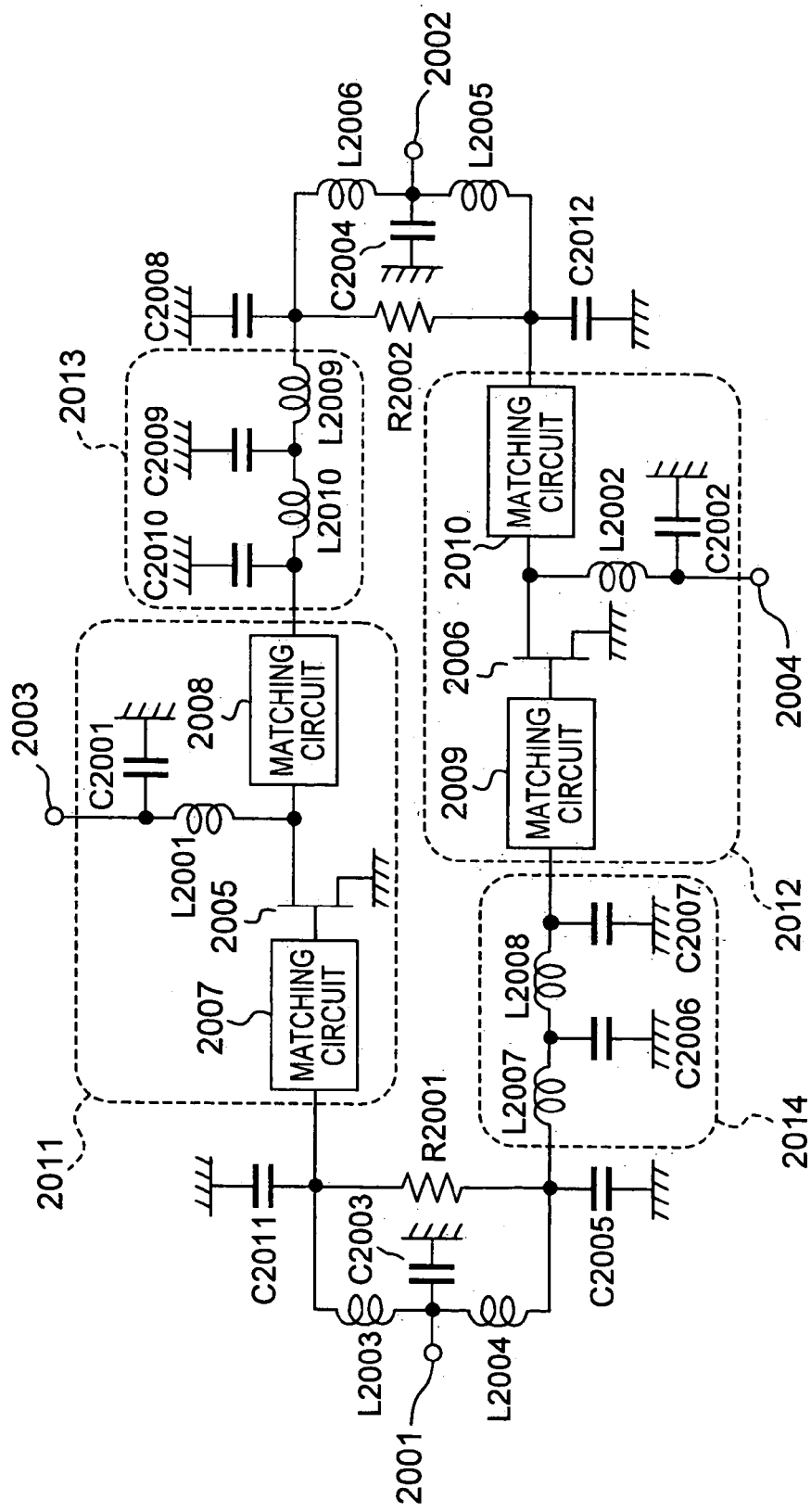
FIG. 20 is a circuit view showing a balanced amplifier circuit in a second prior art.

When the unit amplifiers 2111, 2112 are designed, a multistage circuit with inductance components and capacitance components alternately disposed is adopted as matching circuits 2107, 2109 which are equivalent to the input-side matching circuits 2007, 2009 in FIG. 20. The multistage circuit is composed of two capacitance components C2102, C2103 connected in series and three inductance components L2102, L2103, L2104 which are connected to between both the sides of the capacitance components C2102, C2103 connected in series and grounds as well as to between a junction point between the capacitance components and a ground.

Moreover, a multistage circuit with capacitance components and an inductance component alternately disposed is adopted as matching circuits 2108, 2110 which are equivalent to the input-side matching circuits 2008, 2010 in FIG.

20. The multistage circuit is composed of one inductance component L2105 connected to between input and output sides, and two capacitance components C2104, C2105 which are connected to between both the sides of the inductance component L2105 and a ground.

In view of the circuit of FIG. 21, it is immediately obvious in comparison to the circuits (FIG. 2 and FIG. 10) of the present invention that the number of circuit devices is large. It is clear that not only the number of devices is large, but also a plurality of large device values (C2101, L2101) are used particularly in the bias portion, which causes a problem that a practical circuit size becomes extremely large.

Figure 22:
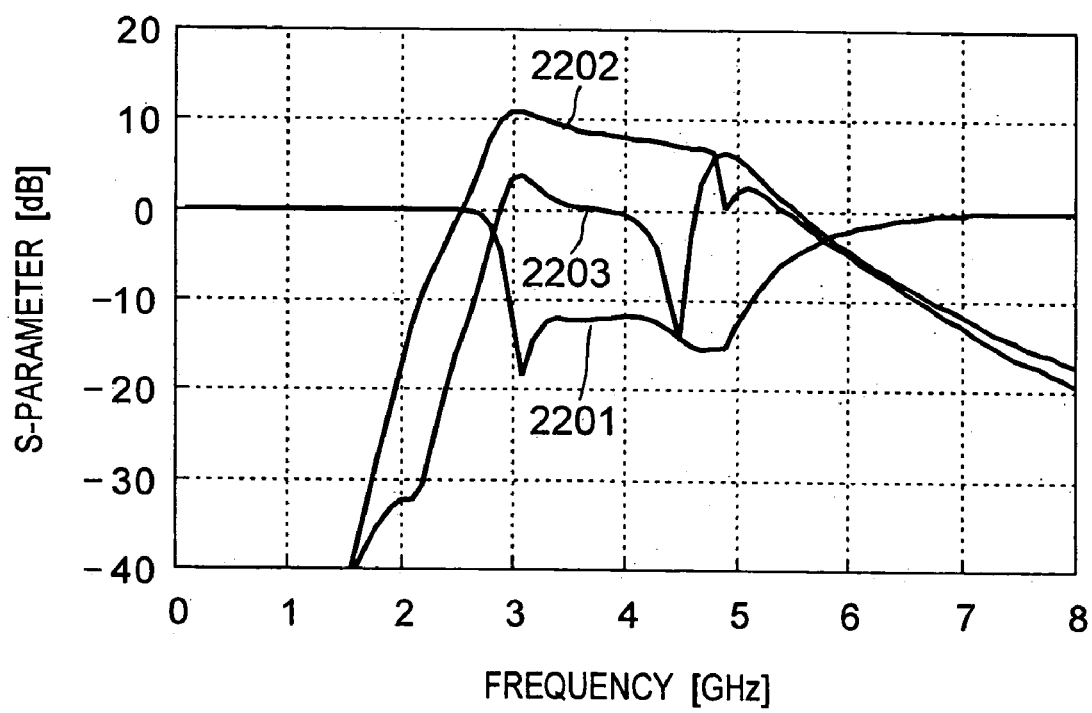
FIG. 22 is a view showing the characteristics of the circuit in FIG. 21.

FIG. 22 shows an example of the characteristic of the circuit in FIG. 21. Circuit device values when the result was obtained are as follows: R2101=1.13069Ω, C2101=10 pF, C2102=1.28055 pF, C2103=2.548 pF, C2104=1.01344 pF, C2105=1.84607 pF, C2106=2.04934 pF, C2107=2.90619 pF, C2108=2.15134 pF, C2109=0.0200138 pF, C2110=1.0232 pF, L2101=10 nH, L2102=1.51739 nH, L2103=0.432792 nH, L2104=0.328032 nH, L2105=0.252816 nH, L2106=0.782266 nH, L2107=1.09702 nH, and L2108=2.48863 nH.

In view of FIG. 22, in the range of about 3 GHz to 4.5 Ghz, a low reflection characteristic 2201 and a high gain characteristic 2202 are obtained for the original odd mode inputs, and therefore it seems that a normal broadband amplifier is successfully implemented. However, there is a problem of a gain characteristic 2203 for the undesired even mode inputs, and it is obvious that the gain characteristic is not at all suppressed except extremely narrow bands around 4.5 GHz. This phenomenon indicates, as pointed out before, the problem of the balanced amplifier circuit in the prior art in FIG. 22, that is, frequency bands in which the circuit performs a normal balance operation, i.e., the frequency bands in which two semiconductor devices 2106, 2107 (shown in FIG. 21) are driven in opposite phase by almost exactly 180 degrees, become extremely narrow.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A balanced amplifier circuit in which a single-ended first unit amplifier and a single-ended second unit amplifier are disposed in parallel and driven substantially with a phase difference of 180 degrees and substantially at identical amplitude, with an output terminal of a semiconductor device in a last stage in the first unit amplifier being a first node, an output terminal of a semiconductor device in a last stage in the second unit amplifier being a second node, and a single output terminal of the amplifier circuit as a whole being a third node; comprising:

a −90 degrees phase-shift circuit for shifting phase substantially by −90 degrees which is connected between the first node and the third node;

a +90 degrees phase-shift circuit for shifting phase substantially by +90 degrees which is connected between the second node and the third node;

a first inductance component and a second inductance component having substantially an identical size which are connected to between the first node and the second node;

a bias feed terminal connected to a middle point between the first inductance component and the second inductance component for feeding a DC bias to the semiconductor device in the last stage in the first unit amplifier and to the semiconductor device in the last stage in the second unit amplifier, wherein between the middle point and a ground a series circuit made up of at least a resistance and a capacitance is provided.

2. A balanced amplifier circuit in which a single-ended first unit amplifier and a single-ended second unit amplifier are disposed in parallel and driven substantially with a phase difference of 180 degrees and substantially at identical amplitude, with an output terminal of a semiconductor device in a last stage in the first unit amplifier being a first node, an output terminal of a semiconductor device in a last stage in the second unit amplifier being a second node, and a single output terminal of the amplifier circuit as a whole being a third node; comprising:

a −90 degrees phase-shift circuit for shifting phase substantially by −90 degrees which is connected to between the first node and the third node;

a +90 degrees phase-shift circuit for shifting phase substantially by +90 degrees which is connected to between the second node and the third node;

a first inductance component and a second inductance component having substantially an identical size which are connected in series between the first node and the second node;

a bias feed terminal connected to a middle point between the first inductance component and the second inductance component for feeding a DC bias to the semiconductor device in the last stage in the first unit amplifier and to the semiconductor device in the last stage in the second unit amplifier;

a first capacitance component and a second capacitance component having substantially an identical size which are connected in series between the first node and the second node; and a resistance component connected to between a middle point between the first capacitance component and the second capacitance component and a ground.

3. The balanced amplifier circuit as defined in claim 1, wherein the +90 degrees phase-shift circuit includes natural numbers of inductance components connected in series and integer numbers of capacitance components connected between end points of the inductance components and grounds.

4. The balanced amplifier circuit as defined in claim 2, wherein the −90 degrees phase-shift circuit includes natural numbers of inductance components connected in series and integer numbers of capacitance components connected to between end points of the inductance components and grounds.

5. The balanced amplifier circuit as defined in claim 1, wherein the +90 degrees phase-shift circuit is a high-frequency transmission line having a length which substantially corresponds to ¼ wavelength in operating frequency bands.

6. The balanced amplifier circuit as defined in claim 2, wherein the +90 degrees phase-shift circuit is a high-frequency transmission line having a length which substantially corresponds to ¼ wavelength in operating frequency bands.

7. The balanced amplifier circuit as defined in claim 1, wherein
the −90 degrees phase-shift circuit includes natural numbers of capacitance components connected in series and integer numbers of inductance components connected between end points of the capacitance components and grounds.

8. The balanced amplifier circuit as defined in claim 2, wherein
the −90 degrees phase-shift circuit includes natural numbers of capacitance components connected in series and integer numbers of inductance components connected to between end points of the capacitance components and grounds.

9. The balanced amplifier circuit as defined in claim 1, wherein
the −90 degrees phase-shift circuit is a high-frequency transmission line having a length which substantially corresponds to ¾ wavelength in operating frequency bands.

10. The balanced amplifier circuit as defined in claim 2, wherein
the −90 degrees phase-shift circuit is a high-frequency transmission line having a length which substantially corresponds to ¾ wavelength in operating frequency bands.

11. A high-frequency communication apparatus comprising the balanced amplifier circuit as defined in claim 1 for use as a balun function-cum-amplifier function for amplifying a modulated signal produced in a balanced output RFIC and sending the signal to a single-ended input high-frequency circuit.

12. A high-frequency communication apparatus comprising the balanced amplifier circuit as defined in claim 2 for use as a balun function-cum-amplifier function for amplifying a modulated signal produced in a balanced output RFIC and sending the signal to a single-ended input high-frequency circuit.

13. The high-frequency communication apparatus as defined in claim 11, comprising:
a plurality of the balanced amplifier circuits, wherein
each fractional bandwidth of a plurality of the balanced amplifier circuits is confined to be less than 100% and each bandwidth of the plurality of the balanced amplifier circuits is designed not to overlap to the other bandwidth, so that plurality of the balanced amplifier circuits are used as transmission power amplifiers.

14. The high-frequency communication apparatus as defined in claim 12, comprising:
a plurality of the balanced amplifier circuits, wherein
each fractional bandwidth of a plurality of the balanced amplifier circuits is confined to be less than 100% and each bandwidth of the plurality of the balanced amplifier circuits is designed not to overlap to the other bandwidth, so that plurality of the balanced amplifier circuits are used as transmission power amplifiers.

* * * * *